(12) United States Patent
Obata et al.

(10) Patent No.: US 8,816,694 B2
(45) Date of Patent: Aug. 26, 2014

(54) APPARATUS AND METHOD FOR DETECTING PARTIAL DISCHARGE AT TURN-TO-TURN INSULATION IN MOTOR

(75) Inventors: Kouji Obata, Hitachi (JP); Keiji Fukushi, Hitachi (JP); Takeshi Obata, Narashino (JP); Koichiro Saito, Funabashi (JP); Tadahiro Shimozono, Yachiyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 0 days.

(21) Appl. No.: 11/190,080

(22) Filed: Jul. 27, 2005

(65) Prior Publication Data

US 2006/0022679 A1 Feb. 2, 2006

(30) Foreign Application Priority Data

Jul. 28, 2004 (JP) .................. 2004-220250

(51) Int. Cl.
*G01R 31/34* (2006.01)

(52) U.S. Cl.
USPC ......................................... 324/536; 324/551

(58) Field of Classification Search
CPC ... G01R 31/1272; G01R 31/34; G01R 31/346
USPC ................ 324/536, 522, 515, 520; 310/132
See application file for complete search history.

(56) References Cited

U.S. PATENT DOCUMENTS

| | | | | |
|---|---|---|---|---|
| 4,463,286 A | * | 7/1984 | Justice | 315/219 |
| 4,949,001 A | * | 8/1990 | Campbell | 310/220 |
| 5,252,927 A | * | 10/1993 | Bruhlmeier et al. | 324/546 |
| 5,594,348 A | * | 1/1997 | Iijima et al. | 324/546 |
| 5,828,227 A | * | 10/1998 | Shiota et al. | 324/772 |
| 6,170,974 B1 | * | 1/2001 | Hyypio | 716/4 |
| 6,192,317 B1 | * | 2/2001 | Yazici et al. | 702/58 |
| 6,297,642 B1 | * | 10/2001 | Shibahara et al. | 324/536 |
| 6,452,416 B1 | * | 9/2002 | Kaneda et al. | 324/772 |
| 6,573,727 B2 | * | 6/2003 | Krahn et al. | 324/536 |

(Continued)

FOREIGN PATENT DOCUMENTS

| | | |
|---|---|---|
| JP | 6-141499 | 5/1994 |
| JP | 8-122388 | 5/1996 |

(Continued)

OTHER PUBLICATIONS

Baker Instruments, "Digital Winding Tester" Nov. 8, 2002 and Jun. 22, 2004, http://bakerinst.com, p. 1-7.*

(Continued)

*Primary Examiner* — Thomas F Valone
(74) *Attorney, Agent, or Firm* — Antonelli, Terry, Stout & Kraus, LLP.

(57) ABSTRACT

Apparatus and method for partial discharge detection of turn-to-turn insulation in motor has a surge generator for generating a surge voltage to the windings of the motor by applying a pulse voltage, and a partial discharge current detector for detecting partial discharge currents between the winding turns of the motor. The surge generator generates in and between the windings of the motor the surge voltage that has the rise time and fall time corresponding to the rise time of the surge voltage observed at the motor terminal when the motor is driven by an inverter, and that is repeated at a frequency of 50 Hz to 20 kHz.

12 Claims, 31 Drawing Sheets

(56) References Cited

U.S. PATENT DOCUMENTS

| | | | |
|---|---|---|---|
| 6,937,027 B2* | 8/2005 | Koo et al. | 324/536 |
| 7,285,960 B2* | 10/2007 | Koch et al. | 324/536 |
| 7,514,967 B2* | 4/2009 | Higashi et al. | 327/108 |
| 8,219,335 B2* | 7/2012 | Marti et al. | 702/65 |

FOREIGN PATENT DOCUMENTS

| | | |
|---|---|---|
| JP | 8-170975 | 7/1996 |
| JP | 9-257862 | 10/1997 |
| JP | 2004-045307 | 2/2004 |

OTHER PUBLICATIONS

IEEE Standards Collection: Electric Machinery, Shop IEEE, Institute of Electrical and Electronics Engineers, IEEE Product No. SE134 CD-ROM, 2004, 1104 pages.*

Proceedings: Electrical Insulation Conference and Electrical Manufacturing & Coil Winding Conference, Cincinnati Convention Center, Oct. 16-18, 2001.*

Baker Instruments, "Voltage Rise Times" Jul. 11, 2006 from bakerinst.com/BakerWeb/Support/FAQ_Document/Voltage_Rise_Times.html, p. 1-4.*

McDermid, William, IEEE Trial-Use Guide to the Measurement of Partial Discharges in Rotating Machinery, IEEE Std 1434-2000, p. 1-55.*

Baker Instruments D65R Digital Winding Tester, "15kV Digital Surge/DC HiPot/ Resistance and Bar-to-Bar tester", Feb. 2004 and Jun. 2004, p. 1-9.*

IEEE STD 522-1992, IEEE guide for testing turn-to-turn insultation on form-wound stator coils for AC rotating electric machines, 1992.*

IEEE STD 522-2004, IEEE guide for testing turn-to-turn insultation on form-wound stator coils for AC rotating electric machines, 2004.*

Stranges, Meredith, et al., "Effect of surge testing on unimpregnated ground insulation of VPI stator coils" IEEE Trans. on Indus. App., V. 38, N. 5, 2002, p. 1460-1465.*

Stranges, Meredith et al., "Effect of surge testing on unimpregnated ground insulation of VPI stator coils", IEEE Trans. on Industry App., V. 38, N. 5, Sep. 2002, p. 1460-1465.*

Baker Tech Sheet 69064, Models D15R, D65R, Baker Instruments, www.bakerinst.com, 2010, p. 1-2.*

IEEJ Technical Report 739, "Impact of Inverter Surge on Insulation System", PTO Translation, 11-5108, p. 1-23.*

Ohata, JP2004-045307, p. 1-23, JPO Machine Translation.*

Technical Report No. 739 of Institute of Electrical Engineers of Japan, Aug. 1999, pp. 14 to 19.

Baker Instrument Company, The Measure of Quality, Testing Theories and Recommendations, pp. 1-11.

* cited by examiner tw >> τ tw = τ tw < τ

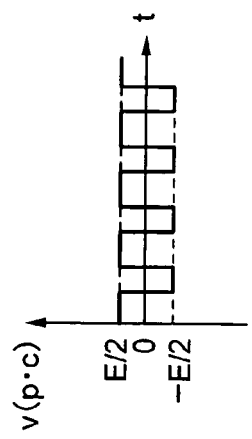
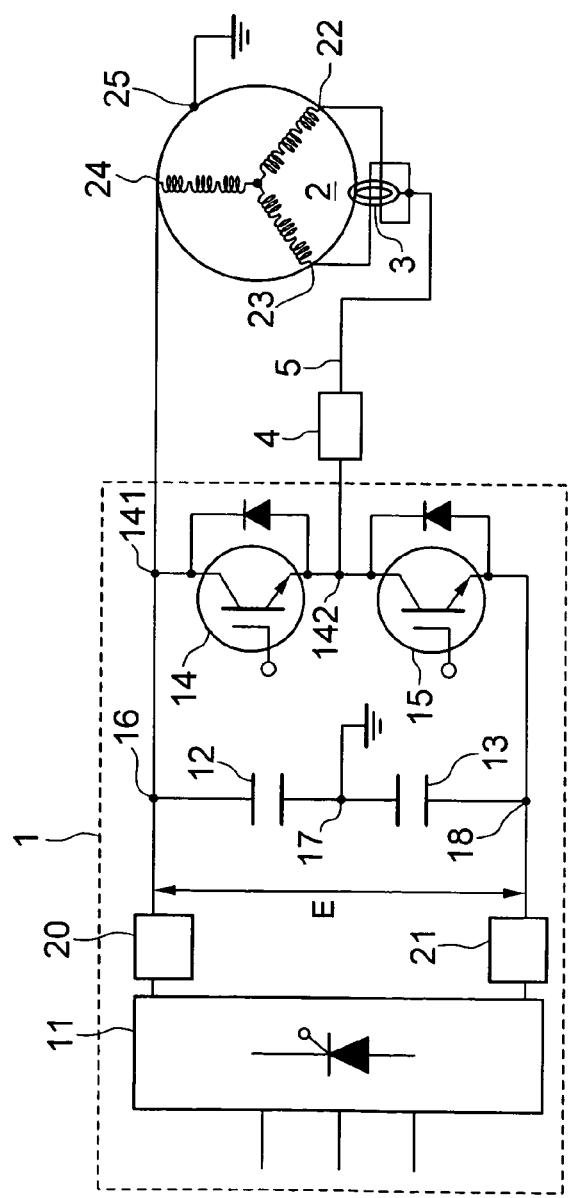

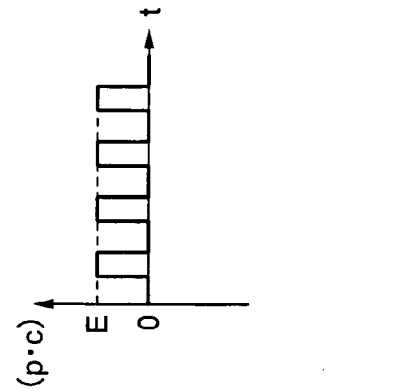
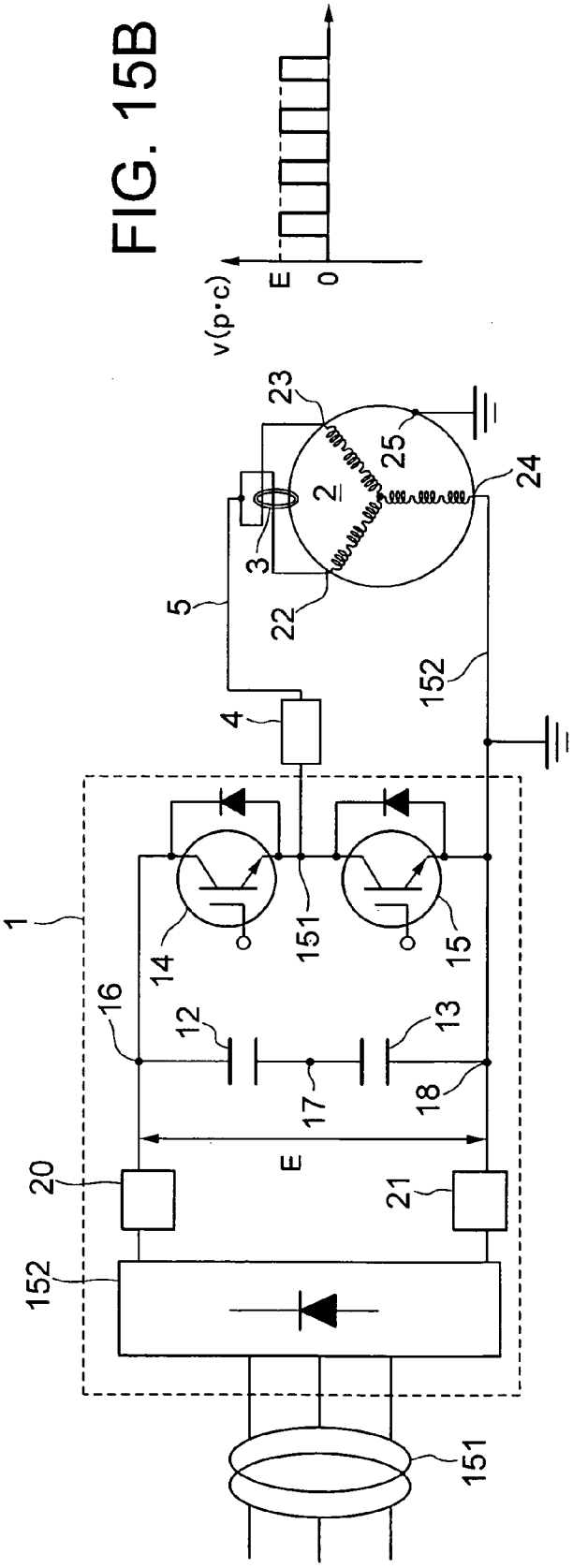
FIG. 15A
FIG. 15B

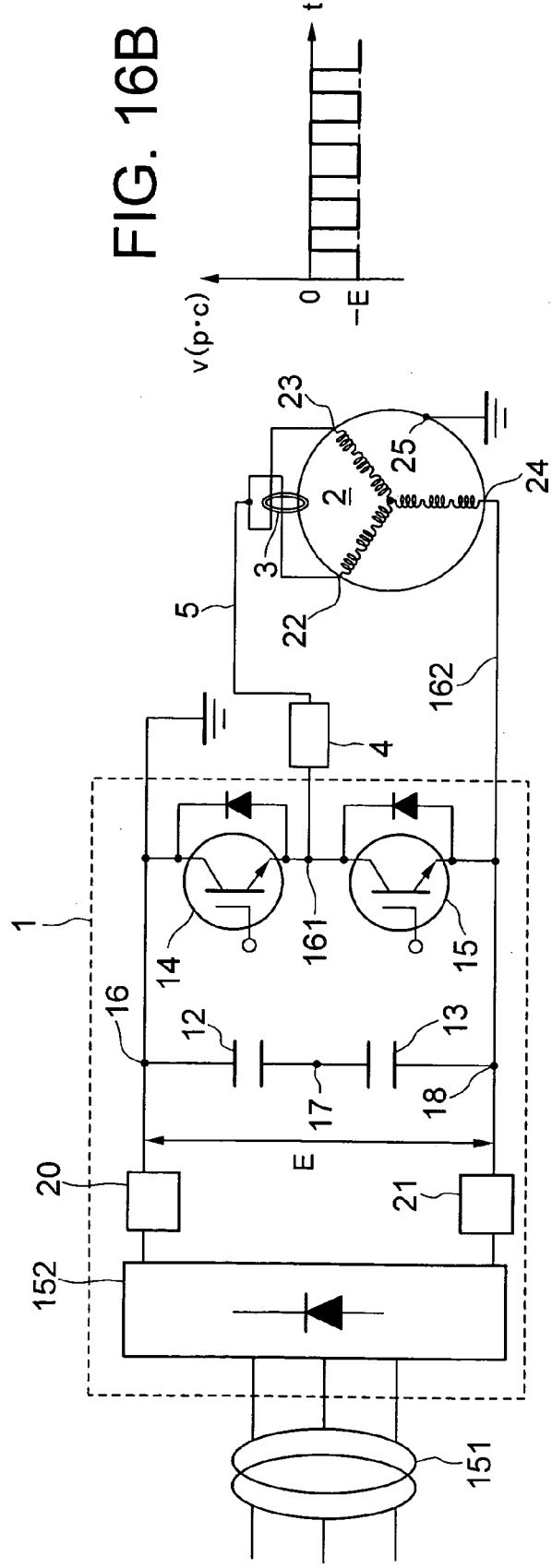

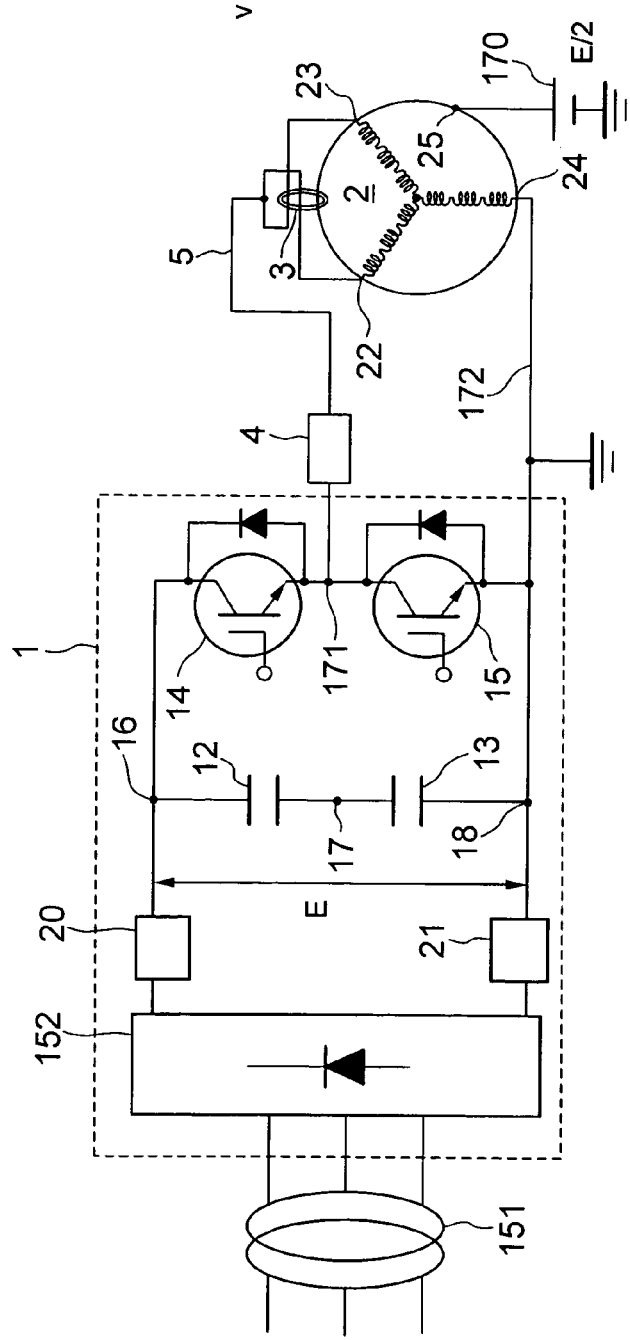

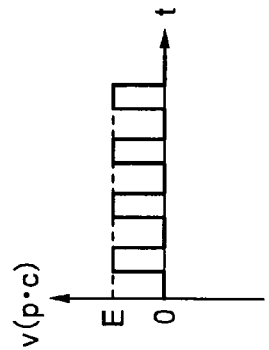
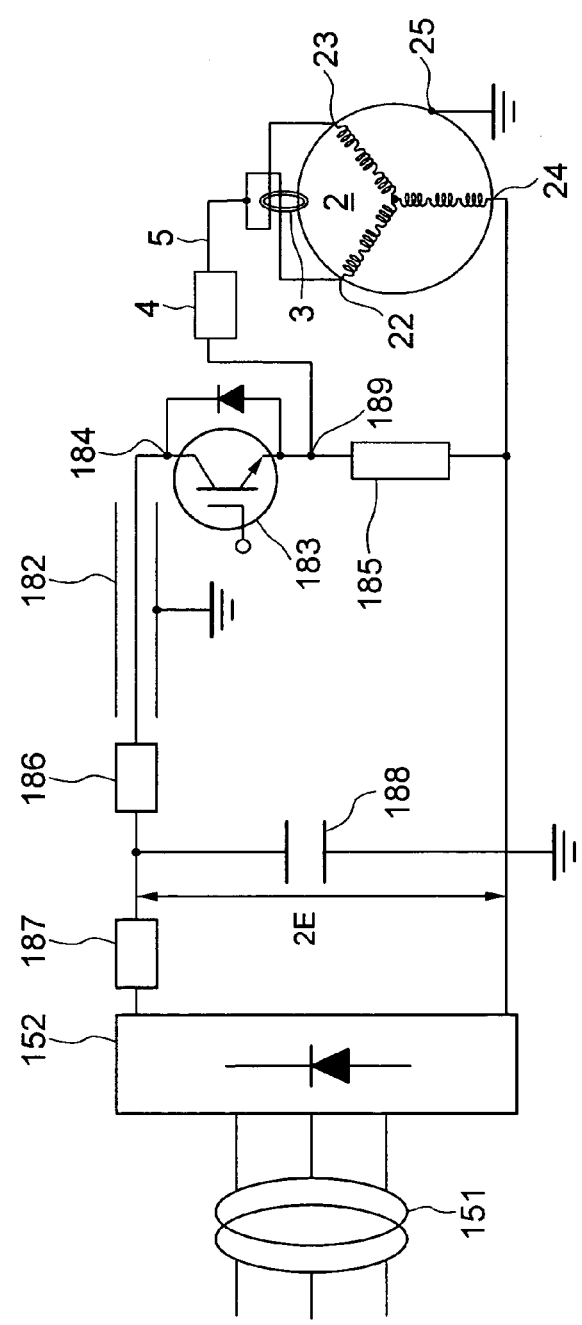
FIG. 18A
FIG. 18B

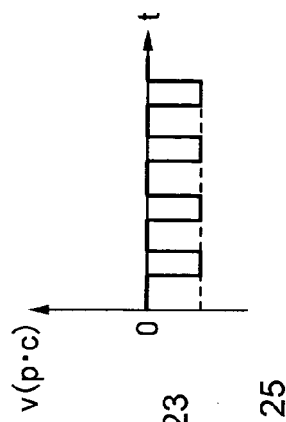
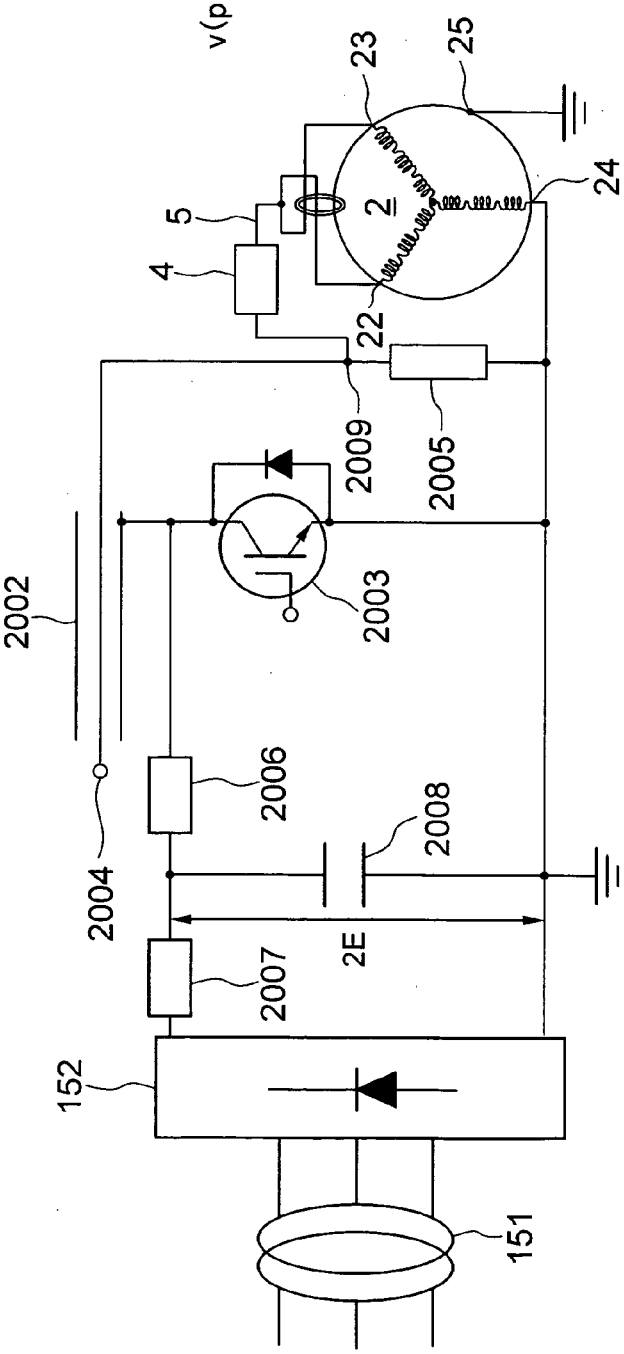

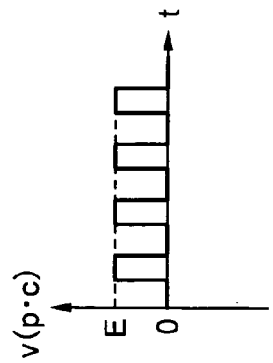
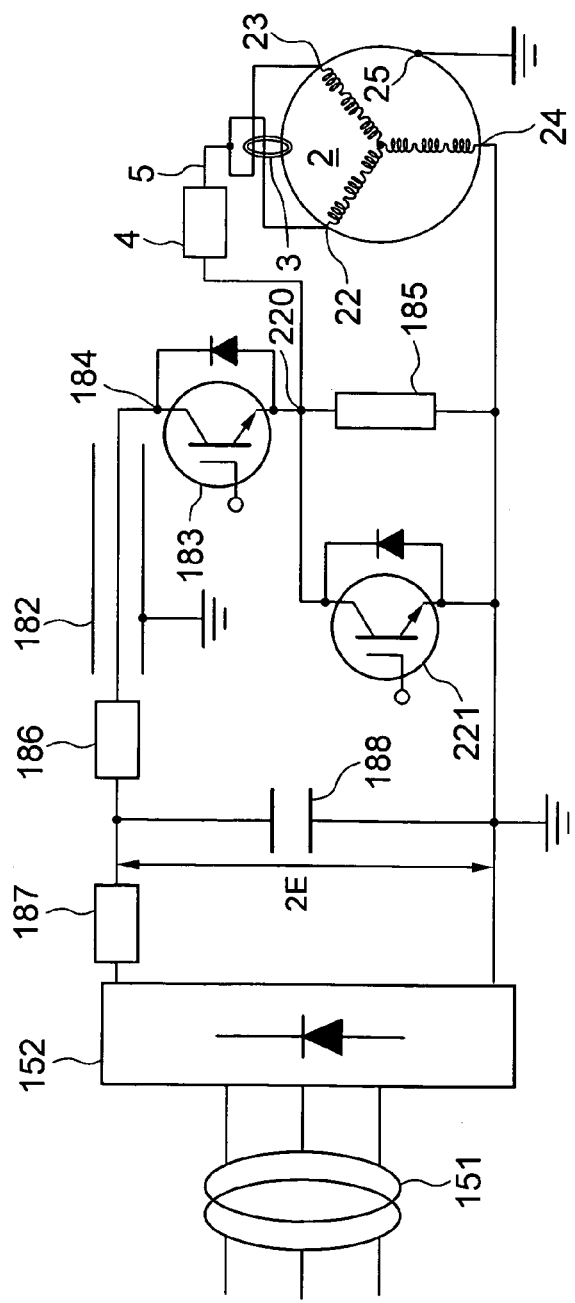

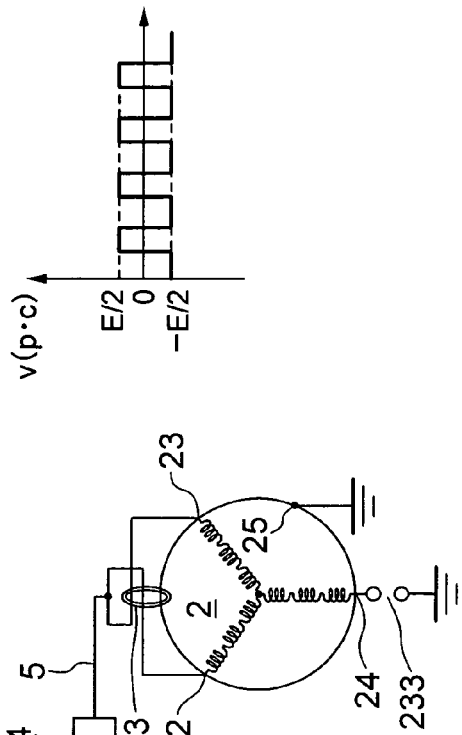
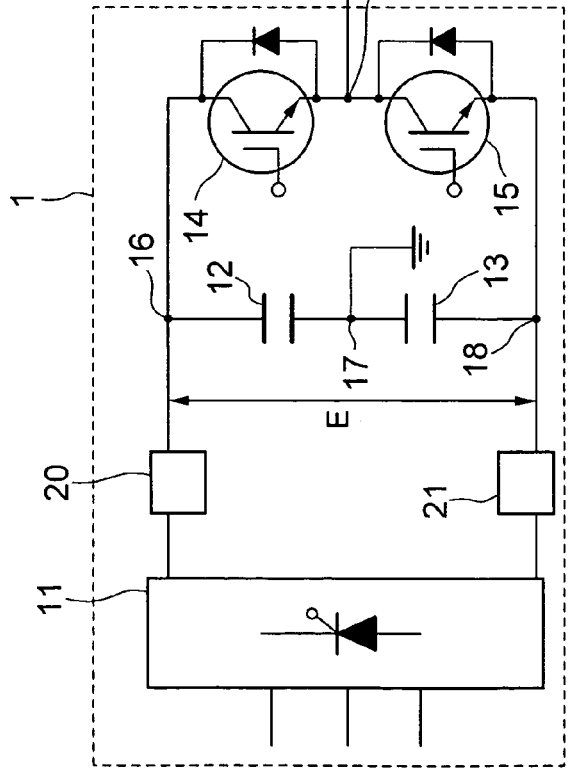
FIG. 23A
FIG. 23B

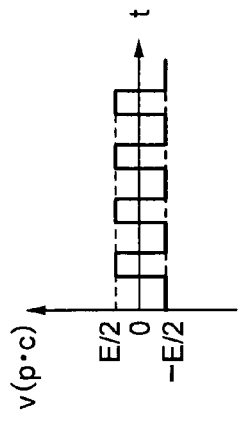
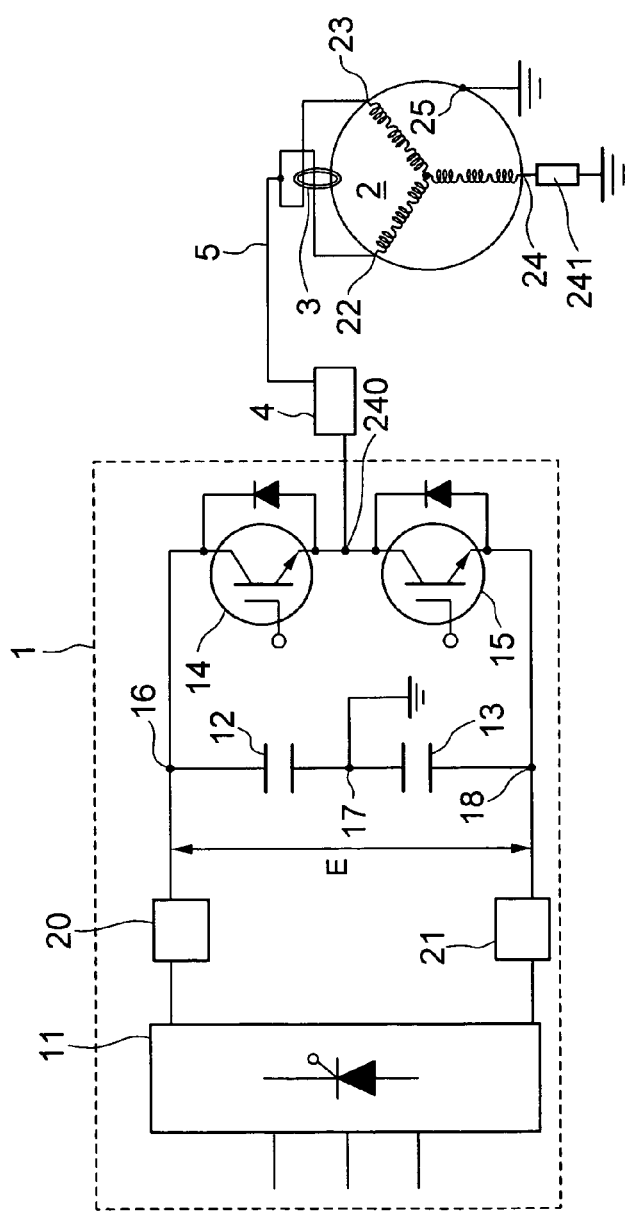

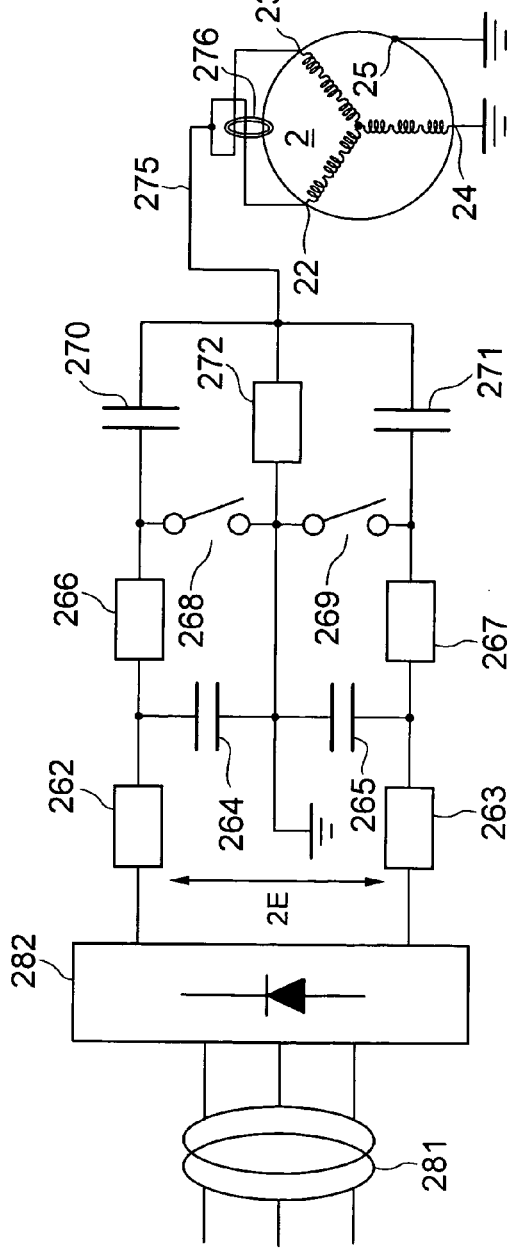
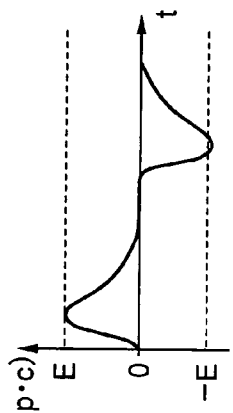
FIG. 26A
FIG. 26B

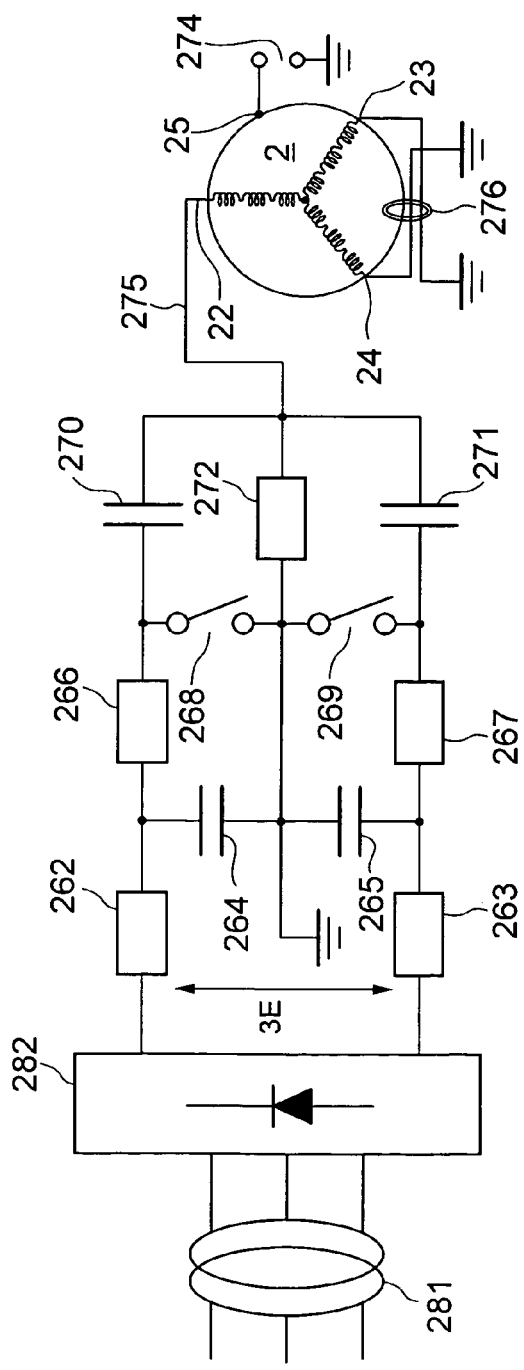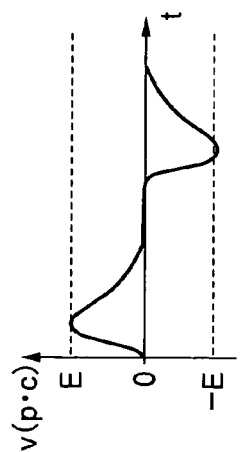

FIG. 29

| EXAMPLES<br>INSULATING PORTIONS<br>MEASURED RESULTS | EMBODIMENTS 1~8 | | | EMBODIMENTS 11 | | | COMPARATIVE EXAMPLE 1 | | |
|---|---|---|---|---|---|---|---|---|---|
| | TURN-TO-TURN | WINDING-TO-CORE | PHASE-TO-PHASE | TURN-TO-TURN | WINDING-TO-CORE | PHASE-TO-PHASE | TURN-TO-TURN | WINDING-TO-CORE | PHASE-TO-PHASE |
| DISTRIBUTED VOLTAGES [Vp-p] | 2,100 | 1,310 | 1,310 | 2,100 | 2,620 | 2,620 | 2,100 | 2,620 | 3,930 |
| PARTIAL DISCHARGE INCEPTION VOLTAGE (CSV) [Vp-p] OF EACH INSULATING PORTION MEASURED IN ELEMENTAL MEDEL | 2,080 | 2,600 | 2,680 | 2,080 | 2,600 | 2,680 | 2,080 | 2,600 | 2,680 |
| RELATION BETWEEN DISTRIBUTED VOLTAGE AND CSV | ≧ | < | < | ≧ | ≧ | < | ≧ | ≧ | ≧ |
| PRESENCE OR ABSENCE OF PARTIAL DISCHARGE | PRESENT | — | — | PRESENT | PRESENT | — | PRESENT | PRESENT | PRESENT |

*: IN EMBODIMENTS 1~8, $t_r = t_f = 0.1\ \mu s$, AND IN EMBODIMENT 11, COMPARATIVE EXAMPLE 1, $t_r = 0.1\ \mu s$, $t_f = 10\ \mu s$

**: IN BOTH EMBODIMENTS AND COMPARATIVE EXAMPLE, SAME INSULATING MATERIAL WAS USED FOR TURN-TO-TURN, WINDING-TO-CORE AND PHASE-TO-PHASE INSULATION

***: CSV OF ELEMENTAL MODELS WAS MEASURED WHEN PULSE VOLTAGE WAS APPLIED

FIG. 30

| | A | B | C | D |
|---|---|---|---|---|
| POWER OUTPUTS OF SAMPLE MOTORS [Kw] | 22 | 220 | 500 | 1450 |
| TURN-TO-TURN SURGE PROPAGATION TIME $\tau$ [$\mu$s] | 0.8~1.0 | 0.5~0.8 | 0.9~1.1 | 1.5~2.0 |

FIG. 31

| EXAMPLES | EMBODIMENTS 1~8 | | EMBODIMENTS 9 | | EMBODIMENTS 10 | |
|---|---|---|---|---|---|---|
| INSULATING PORTIONS / MEASURED RESULTS | TURN-TO-TURN | WINDING-TO-CORE | PHASE-TO-PHASE | TURN-TO-TURN | WINDING-TO-CORE | PHASE-TO-PHASE | TURN-TO-TURN | WINDING-TO-CORE | PHASE-TO-PHASE |
| DISTRIBUTED VOLTAGES [Vp-p] | 2,100 | 1,310 | 1,310 | 2,100 | 1,310 | 2,270 | 2,100 | 1,310 | 1,690 |
| PARTIAL DISCHARGE INCEPTION VOLTAGE (CSV) [Vp-p] OF EACH INSULATING PORTION MEASURED IN ELEMENTAL MEDEL | 2,080 | 2,600 | 2,680 | 2,080 | 2,600 | 2,680 | 2,080 | 2,600 | 2,680 |
| RELATION BETWEEN DISTRIBUTED VOLTAGE AND CSV | ≧ | V | V | ≧ | V | V | ≧ | V | V |
| PRESENCE OR ABSENCE OF PARTIAL DISCHARGE | PRESENT | — | — | PRESENT | — | — | PRESENT | — | — |

*: IN EMBODIMENTS 1~8, $t_r=t_f=0.1$ μs, AND IN EMBODIMENT 11, COMPARATIVE EXAMPLE 1, $t_r=0.1$ μs, $t_f=10$ μs

**: EVEN IN ANY EMBODIMENT, SAME INSULATING MATERIAL WAS USED FOR TURN-TO-TURN, WINDING-TO-CORE AND PHASE-TO-PHASE INSULATION

APPARATUS AND METHOD FOR DETECTING PARTIAL DISCHARGE AT TURN-TO-TURN INSULATION IN MOTOR

BACKGROUND OF THE INVENTION

The present invention relates to apparatus for detecting partial discharges between the winding turns of motor fed by inverter.

Recently, motors have so far been driven frequently by using inverter so that the motors can be run with adjustable speeds from the standpoint of high-efficient energy consumption and energy conservation. In addition, excellent inverters will be produced and used in the future for many apparatus together with the development of the semiconductor-process and inverter-design and -manufacturing technologies and motor-drive control technology. However, it is feared that the insulating portions of the motors could be deteriorated by the steep-fronted surge voltages that are involved in the motors driven by inverter. Thus, it is necessary to elucidate this phenomenon and study how to cope with that.

This phenomenon of insulation aging is described in detail in, for example, Technical Report No. 739 of Institute of Electrical Engineers of Japan August 1999. Particularly, the phenomenon peculiar to the motor fed by inverter is mentioned in the Technical Report, on pages 14-20. As described in this report, higher voltages are applied distributed between the winding turns of the motor than when the motors are driven by the line voltage used so far. The result is that partial discharges occur between the winding turns, thus deteriorating the turn-to-turn insulating portions. Therefore, it is concerned that, since dielectric breakdown is caused in the insulating portions, the motors fail in early stages.

Accordingly, it is necessary that the motor fed by inverter be manufactured with their insulating portions designed properly to prevent partial discharges from being caused between the winding turns when inverter surge voltages are applied, and at the same time, be inspected before the shipment to stop the shipment of defective products. In addition, low-voltage motors are manufactured by using materials of poor breakdown-resistivity characteristics against the discharges that are caused by higher voltages applied between the phases and between the winding and core at the time of inverter driving than when the motors are driven by the line voltage. Therefore, similarly it is necessary that the low voltage motors be also manufactured with those insulating portions designed properly not to cause the partial discharges even when the surge voltages are applied between the winding and the core and between the phases, and at the same time, be examined before the shipment to stop the shipment of defective products.

The conventional measurement of partial discharges between the winding turns of motors is described in, for example, JP-A-8-170975, JP-A-8-122388 and JP-A-9-257862. In the conventional measurement of partial discharges between the winding turns of motors, as described in the above-given examples, one of the three phase windings of a motor was connected to the high-voltage side of the surge power source, and the other phase windings connected to the earth. In addition, the motor core was floated in potential. Under the above condition, the partial discharges between the winding turns were detected while the surge voltage was being applied to the motor. In other words, the partial discharges between the winding turns were measured while the surge voltage was being applied in series to the winding-beginning and -end sides of the motor windings. Moreover, the surge voltage was the generally used impulse test voltage of which the rise time and fall time were respectively 0.1-5 μs and 5-40 μs as described in JP-A-9-257862.

On the other hand, there was no definite test method of measuring the partial discharges in the phase-to-phase insulation and winding-to-core insulation of inverter drive motor across which higher voltages were applied at the time of inverter drive than when the line voltage was applied.

SUMMARY OF THE INVENTION

However, when the partial discharges between the winding turns were tried to detect while impulse voltages were being applied to the motor by using the conventional method, partial discharges were observed not only at the steep-fronted rising portion of the impulse voltage but also in the decay part of voltage waveform after the peak voltage was reached. In the above Technical Report, pages 14-20, of Electrical Engineers of Japan, it is reported that, when an steep-fronted surge voltage is applied to the motor, high voltages are applied distributed between the winding turns, but when a gentle slow-change voltage is applied to the motor, lower voltages are applied distributed between the winding turns.

On the other hand, even though the surge voltage is not steep-fronted, high voltages are applied to the other insulating portions than the turn-to-turn insulation, or specifically across the phase-to-phase insulation and winding-to-core insulation. Thus, the partial discharges observed when the attenuated part of the impulse voltage is applied can be considered to have occurred between the different phases and between the winding and the core. It is clear that the conventional method cannot precisely measure the characteristics of the partial discharges between the winding turns of motor since partial discharges are caused at least between the different phases and between the windings and the core. Thus, partial discharges between the winding turns were measured while the impulse voltage was being applied between the winding-start and winding-end points of the tested phase winding with the other phase windings disconnected. However, partial discharges were observed at the gentle attenuated part of the impulse voltage although the other windings were disconnected.

That is, in the conventional method, it is obvious that, even when the other phase windings are disconnected, partial discharges occur between the tested winding and the core, thus preventing the partial discharges between the winding turns from being correctly measured. Thus, the conventional method cannot precisely measure the partial discharges occurring between the winding turns, and hence cannot directly confirm whether partial discharges have occurred between the winding turns when the manufactured motors are driven by the inverter. In addition, since the partial discharges cannot be confirmed to have occurred between the winding turns of the manufactured motors or not, the prior art needs a countermeasure against that. That is, in order that the partial discharges between the winding turns can be prevented from occurring at the time of inverter drive, the insulating portions is required to be needlessly intensified when considering the defects and irregular characteristics of products in the production process.

On the other hand, any definite test method has not been proposed that can measure partial discharges even between the different phases and between the winding and the core across which higher voltages are applied at the time of inverter drive than when the line voltage is applied. Thus, the insulation portions are required to be strengthened more than necessary for the same reasons. It is generally difficult to simply increase the size of stator core slots within which the motor windings are placed and the size of the coil end portions by the amount corresponding to the insulation reinforcement. This is true from the point of view of the space factor of windings, the mechanical degradation characteristics in the manufacturing process, the coil end dimensions, the shapability, magnetic characteristic, and thermal characteristic and the electromechanical output characteristics of motor. Consequently, the prior art has the fear of the incapability of the optimum insulation design, production and inspection of motors suitable for the inverter drive and the shipment, and hence the fear of the difficulties of energy conservation and high-efficiency small-sized apparatus and facilities.

It is an objective of the invention to provide a method of precisely measuring the partial discharge characteristics of the turn-to-turn insulation of motor windings. The turn-to-turn insulation is one of the insulating portions where we are concerned for fear of its degradation due to partial discharges at the time of inverter drive. The partial discharge characteristics of the turn-to-turn insulation could not be measured in the prior art.

It is another objective of the invention to provide a method of measuring partial discharges in the insulating portions between the winding and the core and between the different phases in the motor fed by inverter, and a motor suitable for the inverter drive that can prevent those insulating portions from causing partial discharges at the time of inverter drive. Any definite test method for measuring the partial discharges in those insulating portions has not been proposed so far.

Various kinds of surge voltages were applied to motors, and measurement and examination were made of the distributed voltages across the insulating portions of the turn-to-turn insulation, the phase-to-phase insulation and the winding-to-core insulation and of the partial discharges caused in those insulating portions. From the results, it was found that the objectives of the invention could be achieved by using the following method. That is, in order that the partial discharges caused between the winding turns can be precisely measured, a surge voltage is applied between the lead wire of the tested phase winding of the motor and the motor core. This surge voltage has the rite time $t_r$ and fall time $t_f$ corresponding to the rise time $t_{rm}$ of the surge voltage observed at the motor terminal at the time of inverter drive. Specifically, the rise time $t_r$ and fall time $t_f$ are each 1.0 μs or below at which the voltage distributed across the turn-to-turn insulation of motor starts to significantly increase. Preferably, the rise time $t_r$ and fall time $t_f$ of the surge voltage applied are selected to be 0.1 μs or below that is observed in the use of 600-V or 1200-V class IGBT and at which the voltage distributed between the winding turns is substantially saturated. In addition, the time between the leading and trailing edges of the surge voltage, or the pulse width $t_w$ in which its amplitude is constant or moderately changes is selected to be more than the propagation time τ of the surge between the winding turns where the surge voltage applied from the inverter to the test motor causes troubles. Specifically, from the results of testing various kinds of motors, it was found that the pulse width should be selected to be at least 1 μs or above, or preferably 10 μs or above. This surge voltage is also repeated at a frequency of 50 Hz-20 kHz. Thus, it is possible to suppress the partial discharges that are probably caused by the first shot surge voltage, except those caused between the winding turns, and to eliminate the error due to the partial discharge statistical time lag and formative time lag when the partial discharge inception voltage is measured. The partial discharge currents can be measured by passing the surge test voltage applying cable of high voltage side through a partial discharge current detector such as a high frequency CT or current probe. The final end of the tested phase winding or the lead wire of another winding, when the final end of the tested phase winding is connected to this lead wire, may be connected to the test power source, directly grounded, grounded through a resistor, inductor or capacitor, or floated.

On the other hand, the motor suitable for the inverter drive in which the partial discharges are not caused in each insulating portion of the motor even at the time of inverter drive can be produced by the following method for insulation design, production, inspection and shipment. In other words, the insulation characteristics and insulation design specification of the motor fed by inverter are examined and determined by the following measurement or simulation. That is, the inverter specification, surge voltage waveform constants, and the voltage distribution of the voltages between the winding turns with respect to the surge voltage rise time are measured or simulated. The inverter specification includes rated voltage, DC voltage, level number, transient voltage step of surge voltage, and rise time of surge voltage and carrier frequency. The surge voltage waveform constants include the peak voltages appearing between the phases and between the winding and the core, the transient voltage step of surge voltage caused between the winding and the core and the rise time of the surge voltage when the inverter is connected through a cable to the motor so as to drive the motor. The results of the above measurement or simulation are used to select the thickness of the insulators necessary to grade the stress so that the partial discharges cannot be caused in each insulating portion. The results are also used to select the varnish suitable for removing air, the methods for the injection, drying and curing of this material, and the candidates of insulating materials required to satisfy the heat resistance property and mechanical strength of the actual motor. After the selection, models are produced that are used as samples to test the insulating portions between the winding turns, between the different phases and between the winding and the core. Pulse voltages are applied to each of the produced samples. The pulse voltages are formed to be similar to the voltages that are actually applied to the insulating portions at the time of inverter drive. Then, the partial discharge inception voltages (CSV) are measured. The measured results are used to select the optimum insulation structure in which the partial discharges are not caused against the voltages applied shared to the insulating portions of the motor at the time of inverter drive. Next, motor samples are produced. First, the ends U, V, W, X, Y and Z of the windings of each of the produced motors are connected together, the pulse voltage or sine-wave line voltage is applied between the windings and the core, and the partial discharge inception voltage (CSV) is measured. Then, the pulse voltage or since-wave line voltage is applied between the different phases of U-X/V-Y/W-Z windings under the condition that the neutral point is disconnected when the motor is of Y-connection windings, or under the condition that the Δ-connection is disconnected when the motor is of Δ-connection. At this time, the partial discharge inception voltage (CSV) is measured. Finally, the partial discharge between the winding turns of the winding U-X, V-Y, W-Z or the Y- or Δ-connection winding is measured according to the invention mentioned above. The partial discharge inception voltage (CSV) between the winding turns of the motor sample is assumed to be the transient voltage step of surge voltage of the winding-to-core voltage at the motor terminal at the time when the partial discharge occurs. The partial discharge inception voltages (CSV), which are measured by the above method between the winding and the core, between the different phases and between the winding turns, are compared to target voltages, respectively. The target voltages are the peak voltage between the motor terminal and the earth (between the windings and the core), the phase-to-phase peak voltage and the transient voltage step of surge voltage to the earth (between the windings and the core) each multiplied by a safety factor $\alpha$. If the partial discharge inception voltages (CSV) are sufficiently higher than the target values, respectively, this insulating system can be employed as the insulating system for the inverter drive, or the insulation design for the motor fed by inverter can be accomplished.

The products examined and designed in the insulation specification by the above method are further actually produced and inspected by the next method. Thus, the individual products can be checked if they have been manufactured to have the insulating system satisfied for the inverter drive, and then shipped. In other words, first, various materials are prepared; such as electromagnetic steel sheet for the motor stator's core, bobbins, enamel or glass for the windings, film-coated insulated wires, insulating films to be interposed between the windings and the core and between the different phases, spacers, tubes, tapes, binding wires and varnish. Then, the coiled windings and stator core are produced by using these materials. The produced coiled windings are mounted in the stator's coil-slots within which the slot insulating material for the winding-to-core insulation is previously inserted, or mounted on the magnetic poles. In addition, spacers for the phase-to-phase insulation are inserted in the coil end portions in which parts of the windings projected out from the stator core are made in contact with each other. When the stator windings are previously covered with an insulating tape for exterior cladding and then inserted in the slots, the slot insulation is not always necessary. The multiple coiled windings inserted in the stator core are connected in series or in parallel to form a one-phase motor winding. In addition, the coil end portions are fixed by heat-resistant binding wires so that the motor windings cannot be vibrated during the operation. In the produced motors before varnish treatment, first the U, V, W, X, Y and Z points of the windings are connected together, and the partial discharge inception voltages (CSV) are measured while a pulse voltage or sine-wave line voltage is applied between the windings and the core. Then, the partial discharge inception voltages (CSV) are measured while a pulse voltage or sine-wave line voltage is applied between the different phases of U-X/V-Y/W-Z windings under the condition that the neutral point is disconnected when the motor is of Y-connection or under the condition that the $\Delta$-connection is disconnected when the motor is of $\Delta$-connection. Finally, the above partial discharge measurement according to the invention is performed between the winding turns of the U-X, V-Y and W-Z windings or the Y- or $\Delta$-connection winding of these windings. The measured partial discharge inception voltages (CSV) across the winding-to-core insulation, phase-to-phase insulation and turn-to-turn insulation are multiplied by an increasing rate $\beta$ of partial discharge inception voltage (CSV) due to varnish treatment. The partial discharge inception voltages multiplied by the increasing rate are compared to the target voltages given above. If the former is higher than the latter, the next varnish treatment is carried out. If the former is contrarily lower than the latter, it can be considered, for example, that the windings may be loosen away from the slot insulation to be in contact with the core between the windings and the slot or that, when the insulating tape for external cladding is clad on the windings, the wrapping may be defective. Moreover, as to the insulation between the different phases, the spacers of paper inserted in the coil ends may be inadequately inserted, deviated out of the proper position or damaged. In addition, as to the insulation between the winding turns, the thickness of the clad insulating layer of the wires may be changed or the layer damaged due to the tension stress or bending stress at the time of producing coils. Alternatively, the insulated wires may have initial defects, for example, pinholes in the enamel coatings through which the wires are made in contact. Therefore, these motors having defects are disassembled, and the insulation-defective portions are removed before the varnish treatment. Then, the motors are again satisfactorily processed for their insulating portions.

The motor's stator produced by the above method is treated with varnish by dropping, coating, spraying or immersing the whole stator windings. The motor windings processed with varnish is taken out from the oven after appropriately drying and curing according to a predetermined hardening schedule. The motor after the varnish treatment is placed under the partial discharge measurement in the same way as is the motor winding before the varnish treatment, so that the partial discharge inception voltage (CSV) of each insulating portion can be measured. The measured partial discharge inception voltages (CSV) and the target voltages are compared with each other. If the former is higher than the latter, the stator is fixed to the frame, and combined with the rotor. Then, the product is shipped after certain electrical, mechanical, heat and rotation tests are carried out, if necessary. If the partial discharge inception voltages (CSV) are contrarily lower than the target voltages, the product is judged to reject as the motor fed by inverter, and it is not shipped. The rejected product is again subjected to an additional insulating process such as varnish treatment, and the partial discharge inception voltages (CSV) are gain measured. If the product does not cause a problem when driven by the line voltage, it can be recycled as a motor for the line voltage drive, thus leading to the reduction of the waste. If the product doe not satisfy the necessary characteristics under the above test method, it is discarded as a defective.

In the above manufacturing and inspecting processes, part or all of the processes for the measurement of the partial discharge inception voltages can be omitted after the varnish treatment under the following conditions. That is, the measured values before the stage of the varnish treatment are much higher than the target voltages or the improvement magnification of the measured values after the varnish treatment is much higher than 1. In the latter case, the partial discharge inception voltages (CSV) can be surely improved by the varnish treatment to be sufficiently higher than the voltages applied to the insulating portions at the time of inverter drive. Alternatively, if the target voltages can be cleared by the varnish treatment irrespective of the presence of the scattering of the partial discharge inception voltages (CSV) due to bad production and to irregular dimensions of the insulating materials, part or all of the processes for the measurement of the partial discharge inception voltages can be omitted before the varnish treatment.

According to the invention, the partial discharge characteristics between the winding turns can be precisely measured that could not be measured in the prior art. At the same time, the motor suitable for the inverter drive can be provided that does not cause partial discharges in each insulating portion at the time of inverter drive.

Other objects, features and advantages of the invention will become apparent from the following description of the embodiments of the invention taken in conjunction with the accompanying drawings.

BRIEF DESCRIPTION OF THE DRAWINGS

FIGS. 14A and 14B are respectively a diagram showing the construction of embodiment 2 of the turn-to-turn partial discharge detecting apparatus according to the invention, and a diagram showing the phase-to-core voltage waveform.

FIGS. 15A and 15B are respectively a diagram showing the construction of embodiment 3 of the detecting apparatus according to the invention, and a diagram showing the phase-to-core voltage waveform.

FIGS. 16A and 16B are respectively a diagram showing the construction of embodiment 4 of the detecting apparatus according to the invention, and a diagram showing the phase-to-core voltage waveform.

FIGS. 17A and 17B are respectively a diagram showing the construction of embodiment 5 of the detecting apparatus according to the invention, and a diagram showing the phase-to-core voltage waveform.

FIGS. 18A and 18B are respectively a diagram showing the construction of embodiment 6 of the detecting apparatus according to the invention, and a diagram showing the phase-to-core voltage waveform.

FIGS. 20A and 20B are respectively a diagram showing the construction of embodiment 7 of the detecting apparatus according to the invention, and a diagram showing the phase-to-core voltage waveform.

FIGS. 22A and 22B are respectively a diagram showing the construction of embodiment 8 of the detecting apparatus according to the invention, and a diagram showing the phase-to-core voltage waveform.

FIGS. 23A and 23B are respectively a diagram showing the construction of embodiment 9 of the detecting apparatus according to the invention, and a diagram showing the phase-to-core voltage waveform.

FIGS. 24A and 24B are respectively a diagram showing the construction of embodiment 10 of the detecting apparatus according to the invention, and a diagram showing the phase-to-core voltage waveform.

FIGS. 26A and 26B are respectively a diagram showing the construction of embodiment 11 of the detecting apparatus according to the invention, and a diagram showing the phase-to-core voltage waveform.

FIGS. 27A and 27B are respectively a diagram showing the construction of the detecting apparatus of comparative example 1, and a diagram showing the phase-to-core voltage waveform.

FIG. 29 is a table showing the presence or absence of partial discharge in each insulating portion in embodiments 1 through 8 and 11, and in comparative example 1.

FIG. 30 is a table showing the surge voltage propagation time τ of each kind of motor.

FIG. 31 is a table showing the presence or absence of partial discharge in each insulating portion in embodiments 1 through 8 and embodiments 9 and 10.

DESCRIPTION OF THE EMBODIMENTS

Figure 1B:
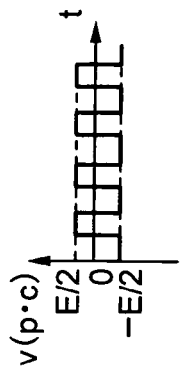
FIGS. 1A and 1B are respectively a diagram showing the construction of embodiment 1 of the turn-to-turn partial discharge detecting apparatus according to the invention, and a diagram showing a surge voltage waveform.
Figure 1A:
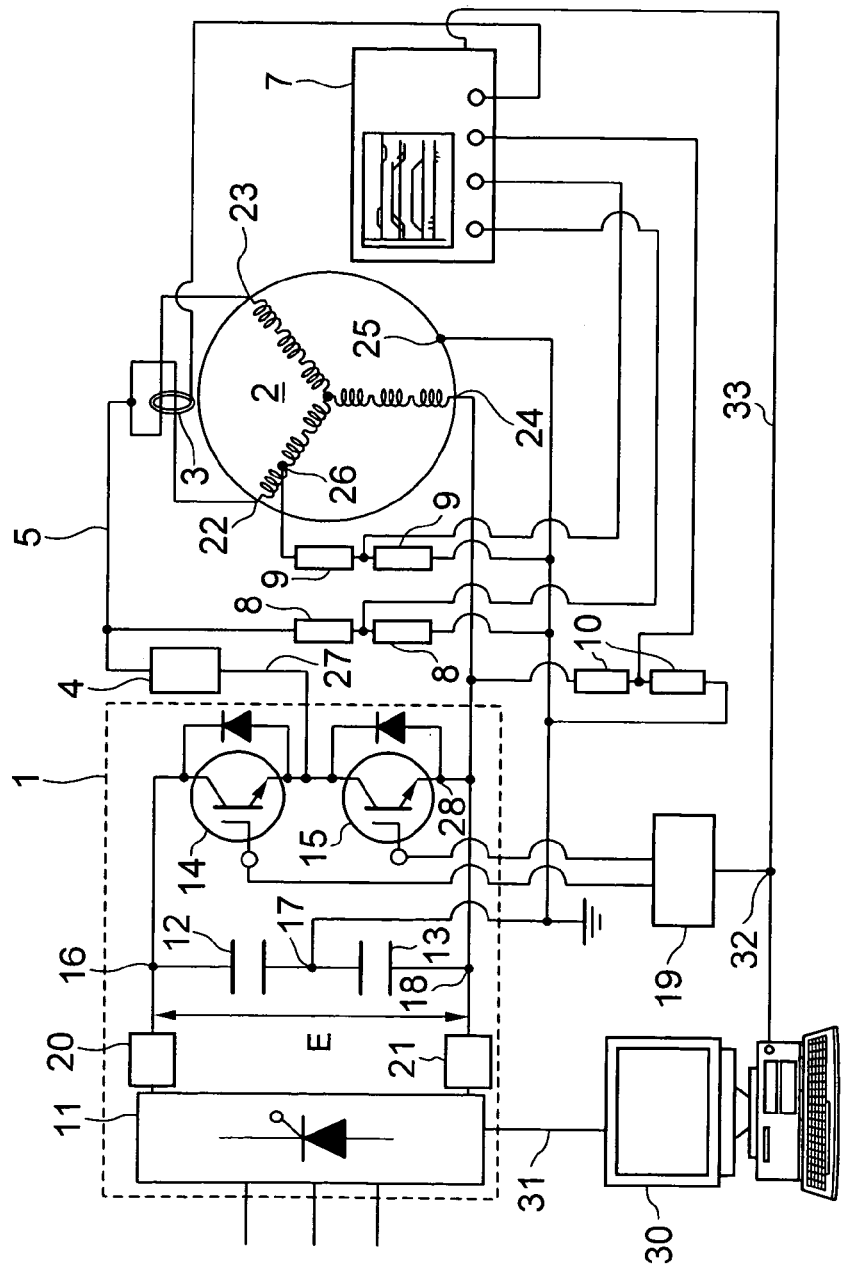

Embodiments of the invention will be described with reference to the drawings. FIG. 1A shows an embodiment 1 of an apparatus for detecting partial discharges occurring between certain winding turns of a motor, according to the invention. The partial discharge detecting apparatus of this embodiment has a surge generator 1, a surge voltage waveform regulator 4, surge voltage detectors 8, 9, 10, a partial discharge current detector 3, an analyzer/display 7, and a control recorder 30. This partial discharge detecting apparatus detects the partial discharges occurring between certain turns of a winding of a test motor 2. The partial discharges occurring between the certain turns of a winding are, for example, the partial discharges occurring between a lead wire 22 of a winding of the test motor 2 and an arbitrary turn 26 of that winding.

The surge generator 1 has an AC-to-DC converter 11, smoothing/overcurrent-detecting elements 20 and 21, DC charging capacitors 12 and 13, and switches 14 and 15 that are respectively provided to supply the positive voltage from the upper arm, 16 and the negative voltage from the lower arm, 18 to the following surge voltage waveform regulator 4. The AC-to-DC converter 11 is a three-phase or single-phase full-wave or half-wave rectifier that is formed of semiconductor elements such as thyristors that are able to change their conducting time. This converter is able to control the magnitude of the output DC voltage by changing the ON/OFF time of the gate signal to the semiconductor elements. The smoothing/overcurrent-detecting element 20, 21 is formed of reactors and resistors to smooth the ripples and high-frequency noise superimposed on DC voltages, and detects the abnormal load such as dielectric breakdown and earth fault by measuring the current flowing from the power source side to the load side. The DC current resulting from the rectification is stored in the capacitors 12 and 13. The junction, 17 between the capacitors 12 and 13 is grounded. If the DC voltage generated by the AC-to-DC converter 11 is represented by E, the capacitors 12 and 13 are each kept at E/2. Thus, the voltages of the upper and lower arms 16, 18 to the earth are E/2 and −E/2, respectively. The control signal from the control recorder 30 is supplied to the switches 14 and 15 directly through a high withstand voltage driver circuit 19 or through the circuit 19 after being subjected to the electric to optical signal conversion and the optical to electric signal conversion. This control signal is then used to control the switches 14 and 15 to turn on or turn off. The switches 14 and 15 may be high-speed switches such as IGBT or MOS-FET devices. The switches 14 and 15 are controlled to serve as a push-pull circuit so that, while the switch 14 is being turned on, the switch 15 is turned off or vice versa. The output, 27 from the surge generator 1 is a surge voltage of −E/2 and E/2 to the earth as illustrated in FIG. 1B, or on the upper right-hand side of FIG. 1A. In this embodiment 1, the rise time and falling time of the surge voltage are each 0.1 microsecond μs. In addition, the pulse width of the voltage E/2 can be changed from 1 microsecond μs to 2 milliseconds ms. The pulse repetition frequency can also be changed from 50 Hz to 20 kHz. In contrast, the carrier frequency of the usual inverter is in a range of 500 Hz to 20 KHz. Thus, a user can test at the carrier frequency of the usual inverter by this equipment. On the other hand, the other output, 28 from the surge generator 1 is a constant voltage of −E/2.

Figure 13:
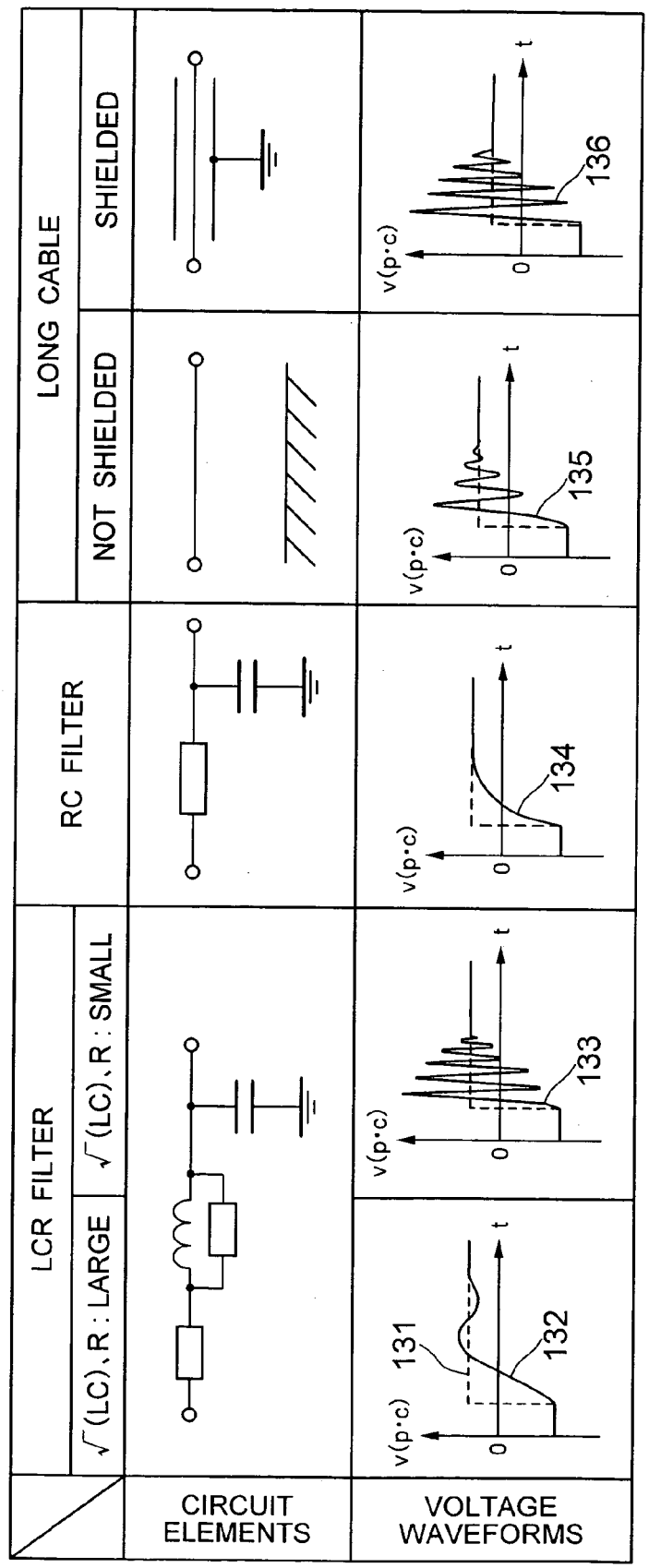
FIG. 13 is a diagram showing examples of the surge voltage waveform regulating circuit arrangement according to the invention.

FIG. 13 shows examples of the surge voltage waveform regulator 4. The surge voltage waveform regulator 4 is formed of, for example, an LCR filter, RC filter or long cable. It can regulate the voltage waveform generated from the output 27 of the surge generator 1 into a waveform necessary for the test on the partial discharges that will be occur between the certain turns of a winding of the motor. In other words, if the surge voltage waveform regulator 4 is formed of an LCR filter, the output waveform, 131 from the surge generator 1 is regulated as below. That is, it is regulated to be a waveform 132 of a slow rise time when both the value ($\sqrt{LC}$) and damping resistor R of the LCR filter are large or to be a fast LC-resonant vibration waveform, 133 when those values are small. In the latter case, it can be simply imitated as the vibration waveform of the motor terminal surge voltage of the motor fed by inverter.

If the surge voltage waveform regulator 4 is formed of an RC filter, the output waveform 131 from the surge generator 1 is regulated to be a waveform, 134 having a voltage rising characteristic according to the charging characteristic that is determined by the time constant of the capacitor and resistor.

If the surge voltage waveform regulator 4 is formed of a long cable that makes the size of the regulator 4 large, it produces a waveform 135 that can be imitated as the vibration waveform of the motor terminal surge voltage of the motor fed by inverter in the actual field. The long cable may be a non-shielded cable used in the actual field or a cable shielded with a steel pipe or flat wire knit. The output waveform 131 from the surge generator 1 is regulated to differ as at 136, 135 under the presence or absence of the shield, respectively, but the regulated waveforms both take resonant waveforms, respectively. The surge voltage waveform regulator 4 also includes a bypass circuit through which the output waveform from the surge generator 1 can be directly produced at the output without change.

Referring back to FIG. 1A, the output 5 of the surge voltage waveform regulator 4 is connected through the partial discharge current detector 3 to the lead wires 22 and 23 of the two windings of the three-phase windings of the test motor 2. The high-voltage connection wires associated with the detector 3 are passed through the detector 3 in opposite directions. Thus, it is possible to cancels out the charging currents simultaneously flowing to the stray capacitances of the motor windings 22 and 23 in accordance with the rapid voltage change with time at the leading and trailing edges of the surge voltage. In addition, it is possible to detect the partial discharging currents with high sensitivity that will be generated on the high-voltage applied side of the tested phase winding. The lead wire 24 of the other phase winding of the three-phase windings of the test motor 2 is connected to the negative-polarity constant-voltage output terminal 28 of the surge generator 1. Since a motor core 25 is grounded, the output voltage from the surge generator 1 is applied between the core and the tested phase windings 22, 23. The voltage applied to each insulating portion of the motor can be measured by connecting surge voltage detectors 8, 9, 10. For example, the voltage detectors can measure the voltages at the output 5 of the surge voltage waveform regulator 4, at the arbitrary turn 26 of the tested motor phase winding, and at the output terminal 28 of the surge generator 1 with respect to the ground.

The analyzer/display 7 is connected to the outputs from the surge voltage detectors 8, 9, 10 and the output from the partial discharge current detector 3. The analyzer/display 7 computes on the output voltages from the surge voltage detectors 8, 9, 10, and displays and records the voltages applied across the insulating portions between the motor winding turns, between the motor winding and the core and between the different phases. In this embodiment 1, specifically the voltage between the winding turns can be determined by analog or digital computation of the difference voltage between the outputs from the surge voltage detectors 8 and 9. In addition, since the motor core 25 is grounded in this embodiment 1, the voltage applied between the winding and the core equals to the voltage of surge voltage detector 8 to the ground. The voltage applied between the phase winding 22, 23 and the phase winding 24 is determined by analog or digital computation of the difference voltage between the outputs from the surge voltage detectors 8 and 10. The output from the partial discharge current detector 3 is connected to an analog or digital high-pass filter or band-pass filter of the analyzer/display 7. Thus, it is possible to remove the charging currents flowing to the stray capacitances of motor windings 22, 23 in accordance with the steep-fronted voltage change with time that occurs at the leading and trailing edges of the surge voltage. Accordingly, it is possible to display and record only the partial discharge currents. The cut-off frequency of the high-pass filter or band-pass filter is required to be 10 MHz or above that is the reciprocal of the rise time or falling time, 0.1 μs of the surge voltage. This cut-off frequency is desired to be in the range from about 30 MHz to 70 MHz. In this embodiment 1, the connection leads of the motor windings 22 and 23 are penetrated through the partial discharge current detector 3 in the opposite directions as described above. Thus it is possible to cancel out the charging currents that simultaneously flow to the stray capacitances of the motor windings 22 and 23 in accordance with the steep-fronted voltage change with time that occurs at the leading and trailing edges of the surge voltage. In addition, since the charging currents left not cancelled out are removed by filters, the partial discharge currents can be measured with high sensitivity. However, if, for example, a particular phase winding is desired to test during the manufacture of the three phase windings, only one phase to be tested may be present. Even in such case, if the cut-off frequency of the filter provided within the analyzer/display 7 is increased by about 10 to 30 MHz, the partial discharge in a particular phase can be detected by using the partial discharge current detector 3.

The control recorder 30 controls the surge generator 1 and analyzer/display 7, and records data. More specifically, the wave height voltage from the surge generator 1 is controlled by supplying a gate pulse signal through a gate signal control line 31 to the rectifier 11. In addition, the generation of the surge voltage is controlled by supplying an input signal through a control line 32 to the driver circuit 19 that thus controls the switches 14 and 15. The presence or absence of partial discharges is detected as follows. A window trigger of over noise level is set in the analyzer/display 7 so that the window trigger is caused when a partial discharge occurs exceeding the window setting voltage. At this time, the partial discharge is recognized as having occurred. The control recorder 30 receives the generated trigger signal, and responds to this trigger to record the magnitude of discharge current and any one of the voltage between the motor winding turns, the voltage between the winding and the core and the voltage between the different phase windings that are being observed at the time of the discharge occurrence. At the same time, it displays and records the transient step of surge voltage with time of the voltage applied between the winding and the core as a partial discharge inception voltage, CSV (Corona Starting Voltage) between the motor winding turns. In the actual test, the DC voltage of the rectifier 11 of surge generator 1 is boosted from 0 V or a voltage level at which the partial discharge was not caused in the past record, and the on/off signal is supplied to the switches 14, 15, thus producing the pulse voltage. At the same time, the presence or absence of a partial discharge is monitored by observing if the trigger is generated or not from the analyzer/display 7. At the time of occurrence of partial discharge, it records the indicated DC voltage output and the voltages applied between the motor winding turns, between the winding and the core and between the different phase windings. In addition, it displays and records the transient voltage step of the winding-to-core voltage at the time of occurrence of partial discharge as the partial discharge inception voltage (CSV) of the turn-to-turn insulation. If the recorded partial discharge inception voltage (CSV) of the turn-to-turn insulation is lower than a target voltage that results from multiplying the transient step of surge voltage applied between the winding and the core at the time of inverter drive by a safety factor α, a warning is issued.

Figure 2:
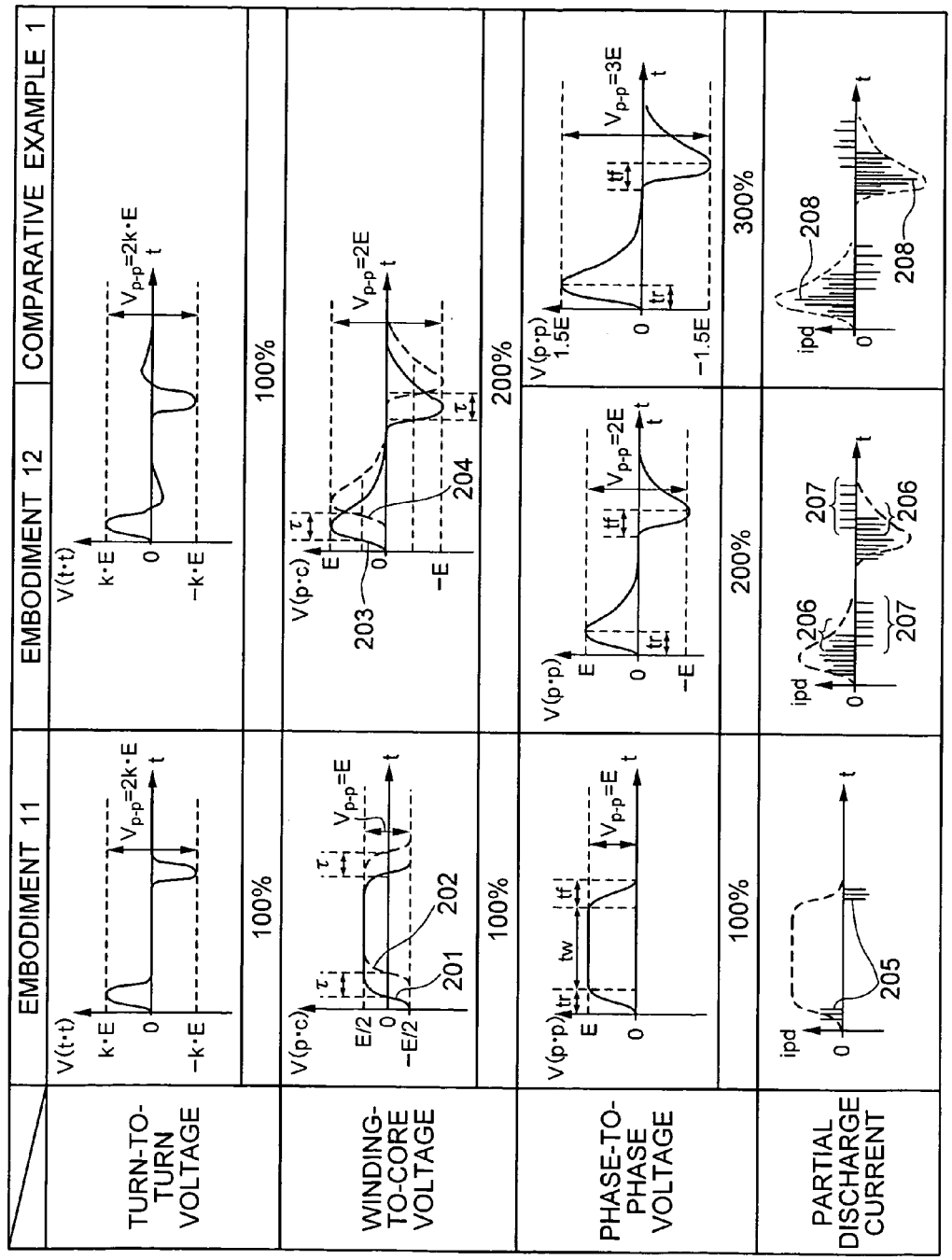
FIG. 2 is a diagram showing the waveforms of the winding-to-core voltage, phase-to-phase voltage and partial discharge current when the distributed turn-to-turn voltages are made constant in embodiments 1 and 11 and in comparative example 1.

FIG. 2 is a diagram showing the measured waveforms in the partial discharge detecting apparatus of the embodiment 1. The waveforms are of the voltages applied between the winding turns, between the winding and the core and between the different phase windings at the leads, and of the partial discharge current when the surge voltage is applied to the lead sides of the tested motor phase windings. As described above, the winding turn-to-turn voltage is determined from the difference between the output voltages from the surge voltage detectors 8 and 9. The winding-to-core voltage is obtained from the output of the surge voltage detector 8. The phase-to-phase voltage is determined from the difference between the output voltages from the surge voltage detectors 8 and 10, and the partial discharge current from the output of the partial discharge current detector 3.

The rise and fall times of the output voltage from the surge generator 1 were selected to be 0.1 μs, and the pulse width of the constant voltage of E/2 was selected to be 10 μs. The repetition frequency of the surge voltage was 50 Hz. The surge voltage waveform regulator 4 allowed the input voltage to directly pass through it without any change. The voltage waveform, 201 of the winding-to-core voltage was measured at the lead end 22 of the test motor phase winding shown in FIG. 1. The voltage waveform, 202 was measured at the arbitrary winding turn 26. The following fact has been found from the results of measuring the voltage waveforms applied to each insulating portion by the detecting apparatus according to the invention. A voltage was caused distributed between the winding turns when the surge voltage was propagated from the voltage-applied lead 22 (voltage waveform 201) of the tested phase winding to the arbitrary winding turn 26 (voltage waveform 202) with a delay of τ. The peak of the partial voltage applied between the winding turns was k=0.8 time as large as the transient voltage step of winding-to-core surge, $\Delta V = E$ (=E/2−(−E/2)). That is, substantially the transient voltage step of winding-to-core surge, $\Delta V$ was applied between the winding turns.

In the conventional test in which the partial discharge occurring between the winding turns is detected by applying a voltage between the start and end points of a motor winding with the core floated in potential, and by this method, an enough voltage of the test voltage generator cannot be applied between the winding turns. Alternatively, it is suggested that the partial discharge occurring between the winding turns cannot be correctly detected because the distributed voltage between the winding turns changes depending on the stray capacitances of the core to the surrounding each time it is measured. In other words, although the conventional test controls the voltage difference between the phases on the test power source side, applies a voltage between the winding turns and detects the partial discharge, the partial voltage applied between the winding turns is actually determined in proportion to the transient voltage step of winding-to-core surge. Therefore, it will be apparent that the partial discharge distributed between the winding turns cannot be accurately detected unless it is measured by controlling the transient voltage step of winding-to-core surge and applying a voltage between the winding turns as in the invention. On the other hand, the winding-to-core voltage was a rectangular wave and had peaks of E/2 and −E/2 and hence peak-to-peak value of E. In addition, the voltage applied between the different phases was a positive-polarity rectangular wave voltage and had a peak-to-peak voltage of E. When the partial discharge current waveform 205 was observed under the condition that voltages were respectively applied between the winding turns, between the winding and the core and between the different phases, partial discharges occurred at the time when a voltage was applied between the winding turns, but no partial discharge occurred at the other times. This implies that the detecting apparatus according to the invention can correctly detect the partial discharge occurring between the winding turns.

FIG. 29 is a table showing the voltages applied to the respective insulating portions at the time when a partial discharge occurs in the motor. It also shows the partial discharge inception voltage (CSV) measured by using elemental models imitated as the respective insulating portions.

Figure 3:
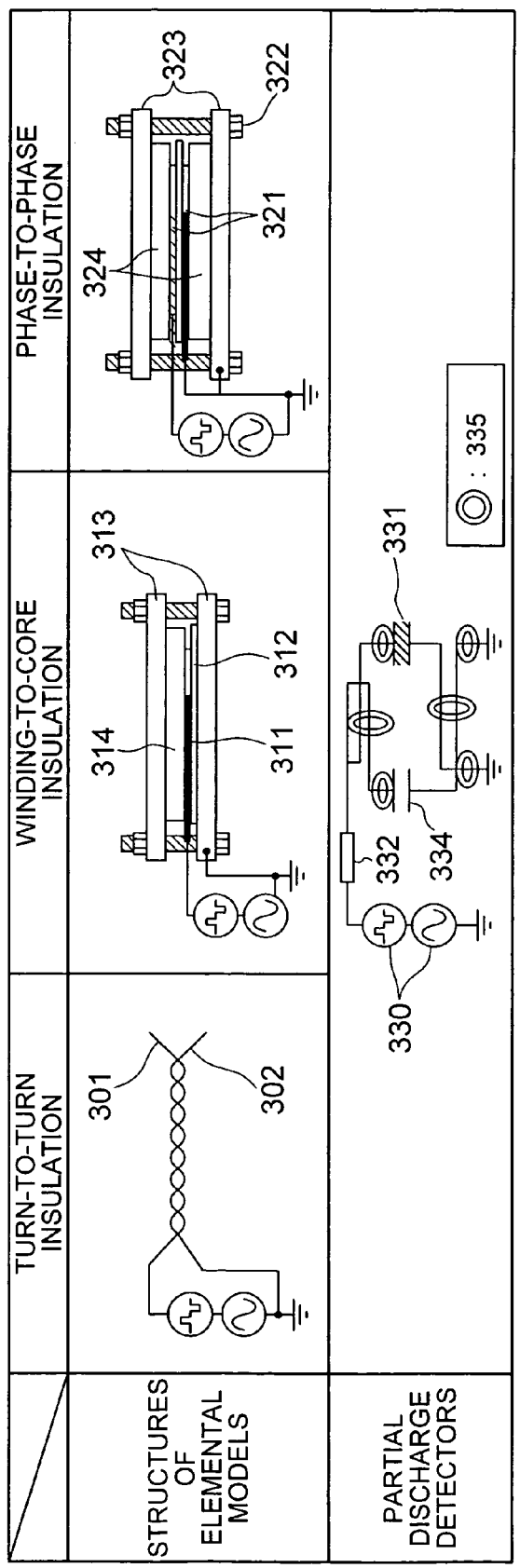
FIG. 3 is a diagram showing the structures of elemental models of the insulating portions and the arrangement of partial discharge testing circuits used for the examination of the insulation of motor fed by inverter.

FIG. 3 shows the elemental models simulated as the insulating portions. The insulation between the winding turns was simulated by using a sample of a pair of twisted enameled wires 301, 302 that were used for the motor windings. The winding-to-core insulation was simulated by a sample formed of an enameled wire 311 used for the motor windings, a polyester film 312 used for the winding-to-core insulation, a silicone rubber mat 314 of 10-mm thickness for stress concentration reduction and insulating spacer, and a pair of 5-mm thick SUS flat plates 313. The structure of this sample was such that the enameled wire 311 was placed on the polyester film 312, the silicon rubber mat 314 was placed over the wire and film, and those wire, film and mat were sandwiched between the flat plates 313 with bolts tightened as illustrated. The insulation between the different phases was simulated by using a sample formed of a polyester film 322 used for the phase-to-phase insulation between the motor coil ends, an enameled wires 321 used for the motor windings, silicone rubber mats 324 for stress concentration reduction and insulating spacer, and SUS flat plates 323. The structure of this sample was such that the polyester film 322 was interposed between the enameled wires 321, and the polyester 322 and enameled wires 321 were held between the silicone rubber mats 324 and then between SUS flat plates 323 with bolts tightened as illustrated. The test for detecting the partial discharge was conducted as follow. A pulse voltage with both polarities was generated as the inverter waveform from a power source that is able to generate a sine wave and the pulse voltage. This pulse voltage was applied to a sample 331 through a blocking resistor and a coil 332. A high-frequency CT 335 was used to measure the partial discharge current flowing in the closed circuit of a coupling capacitor 334 and the sample 331. When a partial discharge occurred, the voltage applied to the sample was recorded as the partial discharge inception voltage (CSV).

From the results shown in FIG. 29, in the embodiment 1, a partial discharge can be considered as caused between winding turns since the voltage applied distributed between the winding turns is higher than the partial discharge inception voltage (CSV) measured in the elemental model. On the other hand, since the voltages applied distributed between the winding and the core and between the different phases are about ½ the partial discharge inception voltages (CSV) measured in the elemental models, the partial discharge can be thought of as not caused. Thus, it will be obvious that the detecting apparatus according to the invention is able to effectively apply a voltage between the winding turns and accurately detect the partial discharge occurring between the winding turns.

Figure 9A:
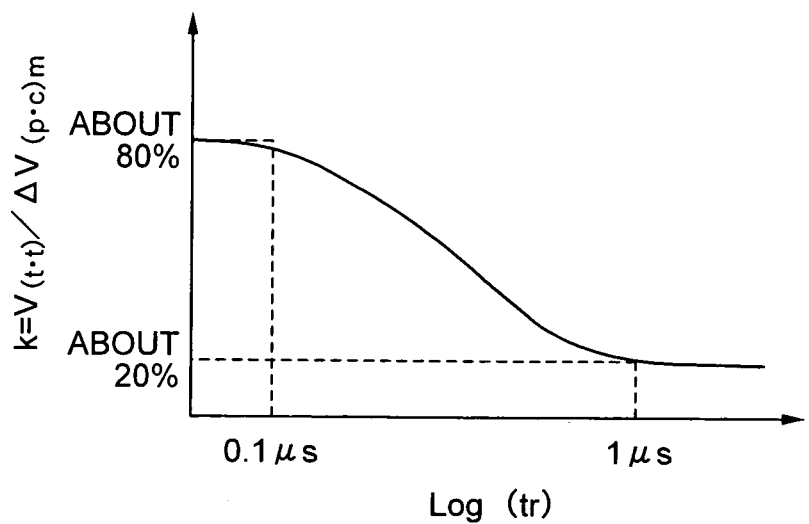
FIGS. 9A and 9B are a diagram showing the measured results of the ratios of the distributed turn-to-turn voltage to phase-to-core voltage with the rise time of surge voltage being changed, and a connection diagram, respectively.
Figure 9B:
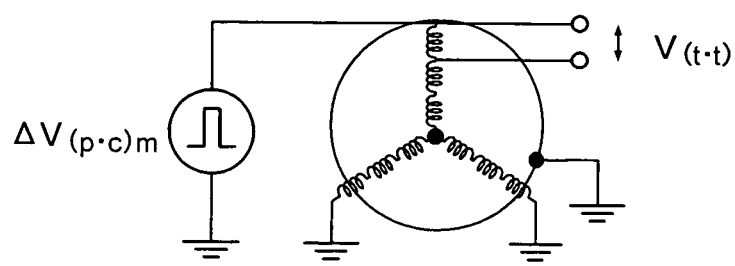

The embodiment 1 selected the rise time and fall time of the surge voltage to be 0.1 μs. However, there is a possibility that a voltage can be applied distributed between the winding turns even if the rise time and fall time of the surge voltage is not always selected to be 0.1 μs. Thus, the voltage applied distributed between the winding turns was measured with the rise time and fall time of the surge voltage being changed. FIG. 9A is a graph showing the results.

In FIG. 9A, the abscissa indicates the rise time of the surge voltage, and the ordinate the turn-to-turn voltage relative to the amount of change of surge voltage to the ground. From FIG. 9A, it will be understood that when the rise time $t_{r(p-c)m}$ of the surge voltage between the winding and the core is 1 μs or above, the voltage distribution ratio k is substantially constant. However, when the rise time is shorter than 1 μs, the voltage distribution ratio k becomes large. For example, it is about 80% at the rise time of $t_{r(p-c)m}$=0.1 μs. Therefore, the rise time and fall time of the surge voltage in the detecting apparatus of the invention should be selected to be less than 1 μs, or preferably 0.1 μs or below. This value is observed when a 600 V or 1200 V class IGBT (Insulated Gate Bipolar Transistor) inverter is used, and the voltage applied distributed between the winding turns is substantially saturated at this value.

In the embodiment 1, the time between the rise time and fall time of the surge voltage, or the pulse width $t_w$ was selected to be 10 μs. However, since the power source must continuously supply a current to the load side while the surge voltage of a constant voltage is being produced, the power source of the surge generator 1 is required to have a large current-supplying capability when the pulse width $t_w$ is long. Thus, the voltage applied distributed between the winding turns was measured with the pulse width $t_w$ changed.

Figure 11A:
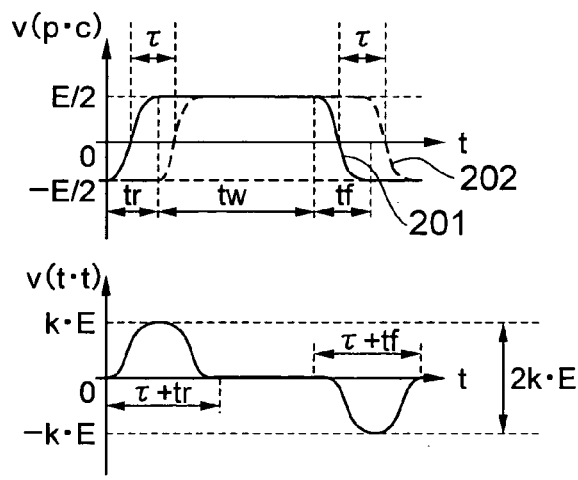
FIGS. 11A, 11B and 11C are respectively diagrams showing the distributed turn-to-turn voltages $V_{(t-t)}$ with the pulse width $t_w$ of the winding-to-core surge voltage V(p-c) being changed relative to the turn-to-turn surge propagation speed τ in the invention.
Figure 11B:
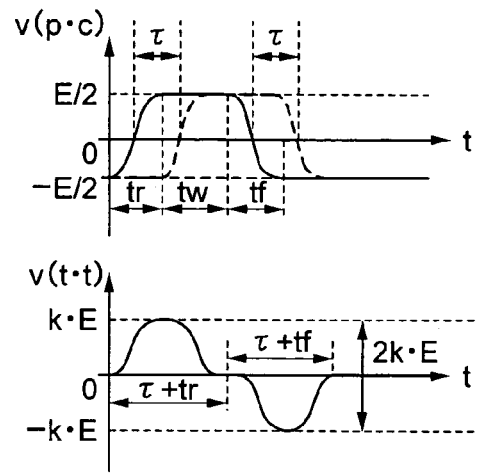
Figure 11C:
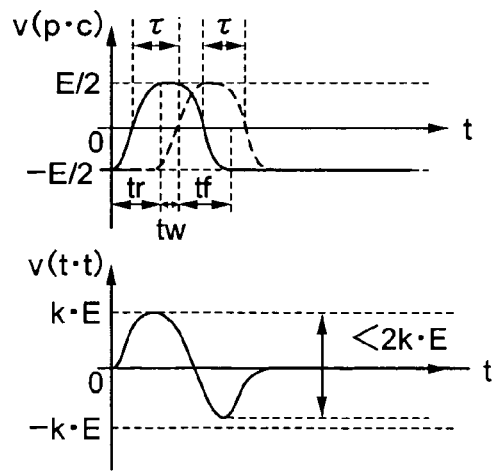

FIGS. 11A, 11B and 11C are graphs showing the voltages $V_{(t-t)}$ distributed between the winding turns when they were measured with the change of the pulse width $t_w$ of the voltage $V_{(p-c)}$ applied between the winding and the core. The pulse width $t_w$ was measured under three conditions where the time τ in which the surge voltage was propagated between the winding turns was used as a reference. At this time, the insulating medium interposed between the winding turns was concerned about its deterioration when the surge voltage was propagated through the motor windings. FIG. 11A is the graph for $t_w \gg \tau$, FIG. 11B for $t_w = \tau$ and FIG. 11C for $t_w \ll \tau$. From the results, the following fact will be understood. As illustrated in FIGS. 11A and 11B, when the pulse width $t_w$ of the voltage $V_{(p-c)}$ between the winding and the core is longer than the propagation time τ of surge voltage between the winding turns, the peak-to-peak value of voltage $V_{(t-t)}$ distributed between the winding turns is a constant of 2·k·E. However, as illustrated in FIG. 11C, when the pulse width $t_w$ is less than the propagation time τ of surge voltage between the winding turns, the peak-to-peak value of the voltage $V_{(t-t)}$ distributed between the winding turns is smaller than 2·k·E. Thus, in the test for the partial discharge between the winding turns, the pulse width $t_w$ of the voltage $V_{(p-c)}$ applied between the winding and the core must be selected to be longer than the propagation time τ of surge voltage between the winding turns where the insulating medium between the motor windings is concerned about its deterioration.

FIG. 30 shows the measured results of the propagation time τ of surge voltage between the winding turns of motors of different power outputs. From the results, it will be seen that the surge voltage propagation time τ is substantially within the range from 1 μs to 2 μs depending on the motor power output. Therefore, in the apparatus according to the invention, the pulse width $t_w$ of the surge voltage $V_{(p-c)}$ applied between the winding and the core is required to be at least 1 μs or above, preferably 10 times this width, or 10 μs or above.

Figure 12:
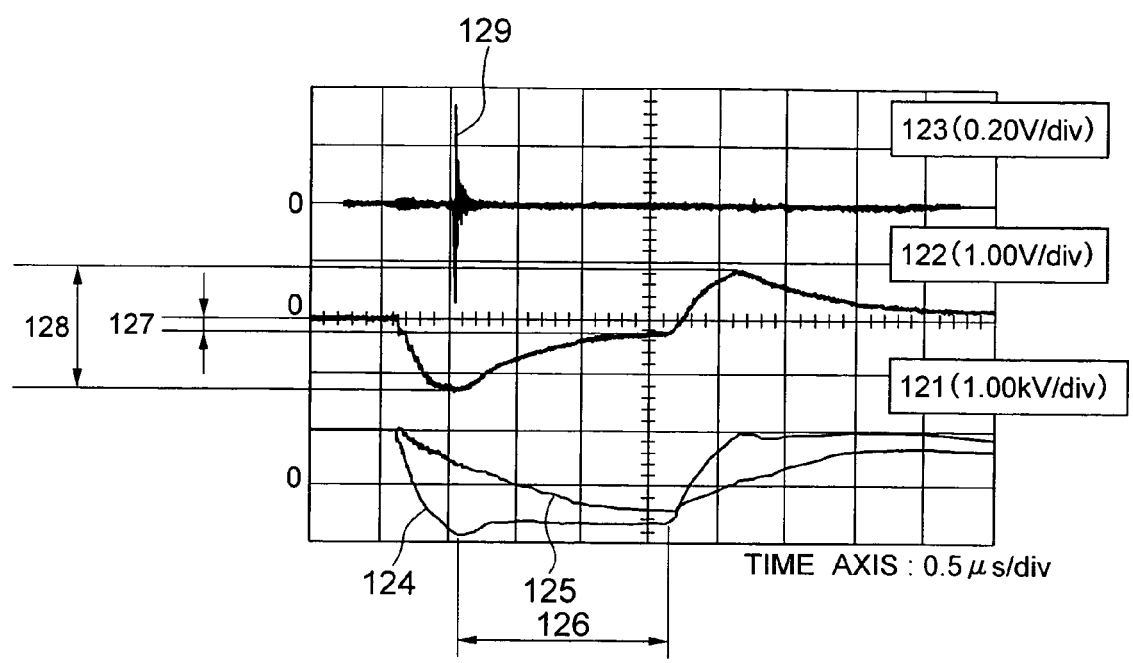
FIG. 12 is a diagram showing the distributed turn-to-turn voltage and partial discharge currents when the surge voltage is applied between the winding and core of a 22-kW motor.

FIG. 12 shows the turn-to-turn voltage developed distributed when a negative-polarity pulse voltage with pulse width $t_w$ of 1.5μ is applied between the winding and core of a 22 kW, 400 $V_{rms}$ class motor. Since the surge propagation time τ of the 22 kW motor was in the range from 0.8 to 1.0 μs as shown in FIG. 30, the pulse width $t_w$ of the surge voltage applied between the winding and core was selected to be 1.5 μs. The winding-to-core voltage, 121 was measured at the two points of the winding start, 124 and winding end, 125 of the phase under test. The pulse width, 126 was about 1.5 μs. The turn-to-turn voltage, 122 was computed from the difference voltage between the winding-to-core voltages measured at the points of winding start point 124 and winding end 125 of the tested phase. The partial discharge current, 123 was also measured, and at this time, the partial discharge current pulse, 129 was observed.

The turn-to-turn voltage 122 has the negative-polarity voltage peak appearing first with the delay of the negative-polarity voltage-varying portion of the winding-to-core voltage 121, and then the positive-polarity voltage peak appearing with the delay of the positive voltage-varying portion of the applied voltage 121. In the 22 kW motor, however, the propagation time between the surge voltages 124 and 125 is short at around the trailing edge of the surge voltage, but long at around the peak unlike the case shown in FIG. 11. In addition, as a result of particularly extrapolating the surge propagation time at around the peak, it becomes about ten times the surge propagation time, $\tau$=0.8 µs measured at the intermediate potential of the peak-to-peak voltage.

The former could be ascribed to the fact that since the winding turns of the test motor are coupled by large capacitances, the steep-fronted voltage components of the surge voltage is propagated through the capacitive insulation. The latter could be caused by the fact that since the windings of the test motor have their LC filter action, iron loss and copper loss at high frequencies, the high-frequency components of the surge voltage is attenuated when the surge voltage is propagated in the windings. In other words, the results shown in FIG. 11 cannot be always obtained for all motors. Consequently, since the positive-polarity voltage change is caused before the negative-polarity voltage change is converged to 0, the peak-to-peak voltage 128 of the turn-to-turn voltage 122 is reduced by the voltage offset, 127 as compared with the peak-to-peak voltage presumed from the winding-to-core voltage 124. The voltage offset 127 is ascribed to the occurrence of the positive-polarity voltage change before the return of the negative-polarity voltage to 0 V. Therefore, when the turn-to-turn partial discharge of each motor is detected, the pulse width $t_w$ of the surge voltage applied between the winding and the core must be selected to be at least more than the turn-to-turn surge propagation time $\tau$ of a motor under test, or preferably more than 10 times that propagation time.

Figure 28:
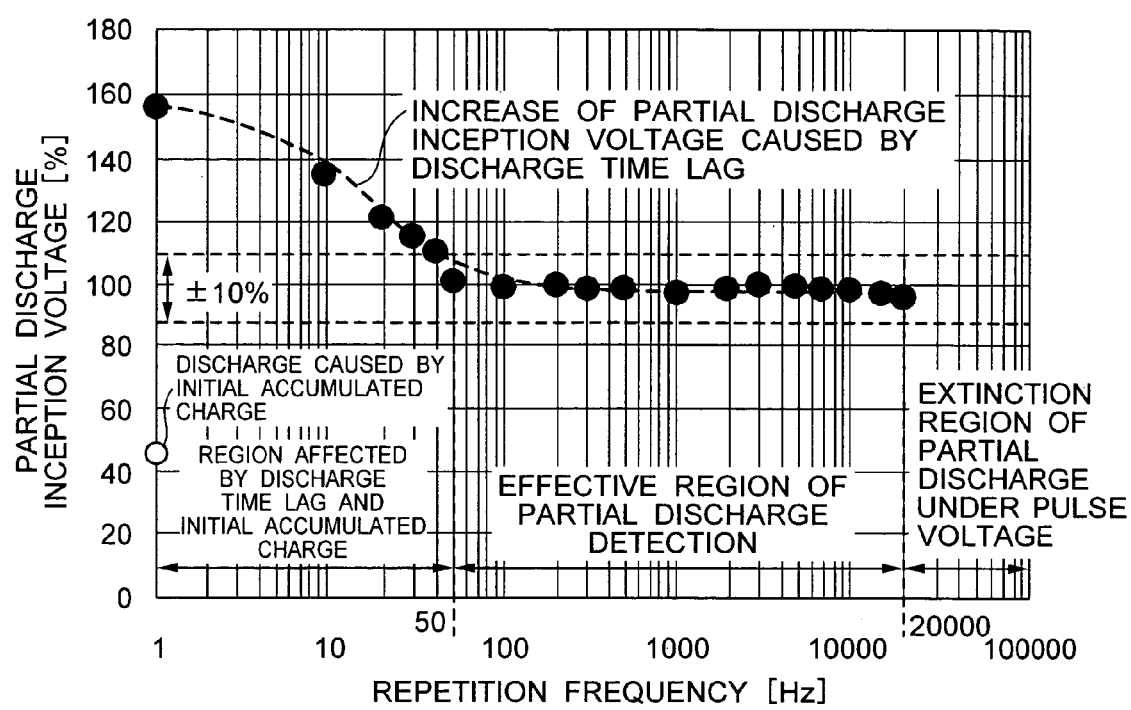
FIG. 28 is a graph showing the partial discharge inception voltage with respect to the repetitive frequency.

In the embodiment 1, the repetition frequency of the surge voltage was selected to be 50 Hz. FIG. 28 shows the measured results of the partial discharge with the trigger to the surge voltage being supplied from the outside and with the repetition frequency of the surge voltage changed. The ordinate indicates the partial discharge inception voltage of which the scale mark 100% corresponds to the partial discharge inception voltage 2,080 $V_{p-p}$ between the winding turns of the elemental model shown in FIG. 29. When the repetition frequency of the surge voltage was lower than 50 Hz, the partial discharge inception voltage increased with the decrease of the repetition frequency, and at this time the measurement error increased. When a single-shot surge voltage was applied by using a manual trigger, the partial discharge inception voltage was reversely reduced. After the examination of these causes, it was found that the former was probably due to the statistical time lag and formative time lag of the partial discharge inception voltage. In addition, the latter case may be caused by the initial electrostatic charges accumulated on the surface of the winding-to-core or phase-to-phase insulation. Therefore, according to the invention, in order to detect the turn-to-turn partial discharge, it is necessary to increase the repetition frequency of the surge voltage. Particularly in order to suppress the measurement error of the partial discharge inception voltage to less than ±10% of that of the elemental model, it is desired that the repetition frequency be selected to be 50 Hz or above as in the embodiment 1. Thus, we examined the case in which the repetition frequency was further increased. As a result, the partial discharge current 205 of a pulse shape shown in FIG. 2 was observed until the repetition frequency reached 20 kHz. At repetition frequencies of over 20 kHz, however, the partial discharge pulse current 205 shown in FIG. 2 was not observed. This will be caused by the fact that when the repetition frequency of the surge voltage is excessively increased, the discharge mode may be shifted from pulse to glow discharge, so that the discharge could not be measured. Thus, in the turn-to-turn discharge detection according to the invention, the repetition frequency of the surge voltage should be selected to be desirably in the range from 50 Hz to 20 kHz.

Figure 4:
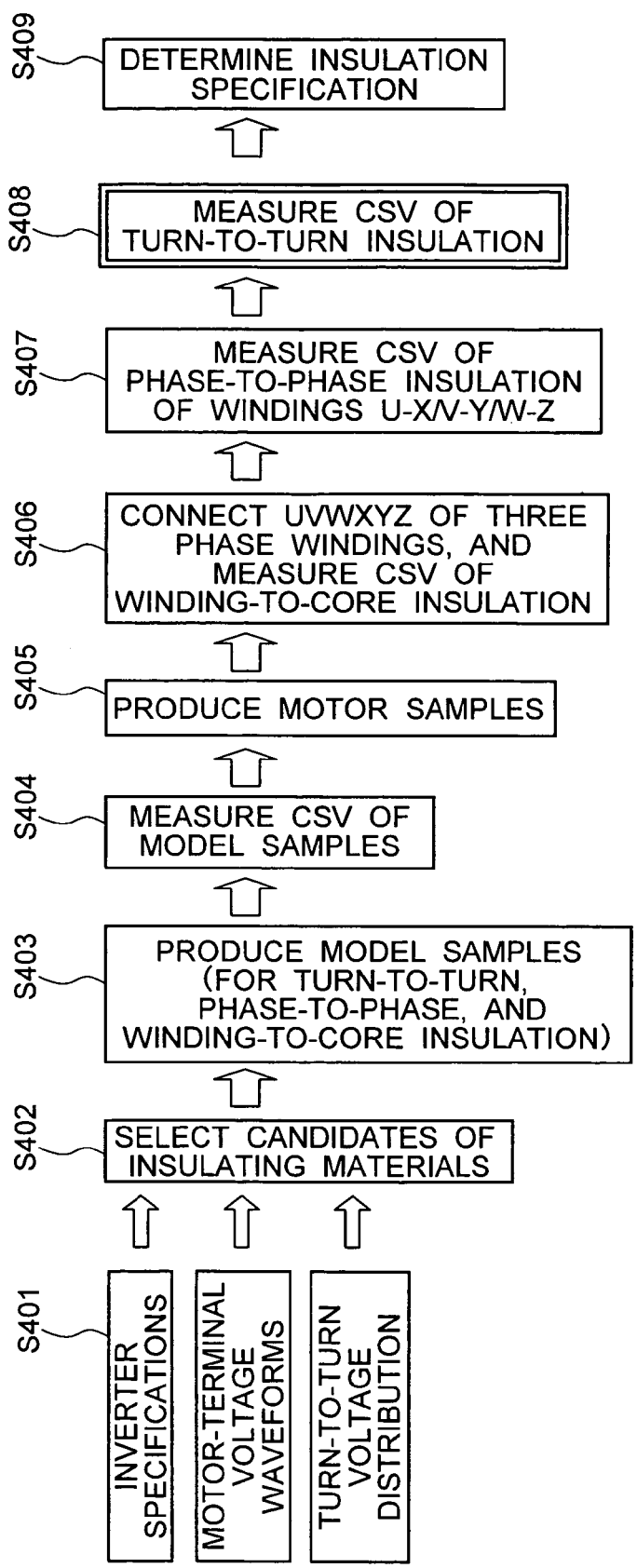
FIG. 4 is a diagram useful for explaining a method of examining the insulation specification of motor fed by inverter.

FIG. 4 shows a method of designing the insulation of the motor suitable for the inverter drive, which was contrived by using the apparatus for partial discharge detection of turn-to-turn insulation in motor according to the invention and the related knowledge. First in step S401, we examined the insulation characteristic of the motor fed by inverter and decided the insulation design specification. The inverter specification includes rated voltage $U_{rms}$, DC voltage DCV, level number N, transient voltage step of surge voltage $\Delta V_i$, rise time $t_{ri}$ of surge voltage, and carrier frequency $f_c$. The surge voltage waveform constants include the phase-to-phase peak voltage $V_{p(p-p)m}$ and winding-to-core peak voltage $V_{p(p-c)m}$ of the motor terminal, the transient voltage step of winding-to-core surge $\Delta V_{(p-c)m}$ and the surge voltage rise time $t_{r(p-c)m}$ when the motor is connected through a cable of length $L_k$ to the inverter. These inverter specification, surge voltage waveform constants and turn-to-turn voltage distribution $k=V(t-t)/\Delta V_{(p-c)m}$ to the surge voltage rise time $t_{r(p-c)m}$ are measured or estimated by simulation. More specifically, when the motor to be driven by a 400 $V_{rms}$ class-2 level inverter is designed for the inverter drive specification, the DC voltage to the inverter is about 570 V in the case of a diode rectifying circuit, the level number is 2, and the transient voltage step of surge voltage $\Delta V_i$ is about 570 V. The surge voltage rise time $t_{ri}$ was 0.08 µs from the actual measurement at the inverter output end. The carrier frequency $f_c$ was selected to be 5 kHz from the range of 500 Hz-16 kHz according to the specification of the customer's demand. The phase-to-phase peak voltage $V_{p(p-p)m}$ and the winding-to-core peak voltage $V_{p(p-c)m}$ at the motor terminal were measured under the condition in which the inverter and the motor were connected through a shielded cable of $L_k$=50 m. Consequently, the positive- and negative-polarity winding-to-core peak voltage and phase-to-phase peak voltage were $V_{p(p-c)m}$=860 $V_p$ and $V_{p(p-p)m}$=1,140 $V_p$, respectively. The transient voltage step of winding-to-core surge and the surge voltage rise time were $\Delta V_{(p-c)}$=1,140 V and $t_{r(p-c)m}$=0.1 µs, respectively. Therefore, in the motor suitable for inverter drive, the winding-to-core, phase-to-phase and turn-to-turn partial discharge inception voltages (CSV) are required to be at least higher than 860 $V_p$, 1,140 $V_p$ and 1,140 V, respectively. On the other hand, the turn-to-turn voltage distribution k of the corresponding capacity- and voltage-class motor relative to the surge voltage rise time $t_{r(p-c)m}$ was obtained as shown by the characteristic curve of FIG. 9A. In other words, the turn-to-turn voltage distribution ratio k to the transient voltage step of winding-to-core surge was substantially constant when the winding-to-core surge voltage rise time $t_{r(p-c)m}$ was 1 µs or above, but it increased as the rise time decreased away from 1 µs. When the surge voltage rise time observed at the motor terminal was $t_{r(p-c)m}$=0.1 µs, the turn-to-turn voltage distribution ratio k was about 80%. As a result, both-polarity peak voltage of $k \cdot \Delta V_{(p-c)m}$=910 $V_p$ is applied distributed between the winging turns of the motor under test.

Then, in step S402, we selected insulating materials having a specific dielectric constant and thickness and several different candidates of varnish necessary to prevent any partial discharge from occurring against the obtained phase-to-phase voltage, winding-to-core voltage and turn-to-turn voltage. In step S403, we produced the samples of turn-to-turn, phase-to-phase and winding-to-core insulation models. FIG. 3 is a schematic view of the insulation model samples. Specifically, turn-to-turn insulation samples of twisted pairs were produced by preparing enameled wires having different film thicknesses and diameters for motor windings, and by twisting wires 301 and 302 of the same specification as illustrated.

In step S404, pulse voltages were applied to the produced samples, and the partial discharge inception voltages (CSV) of the samples were measured. The measured partial discharge inception voltages (CSV) of the enameled-wire twist samples were 750 $V_p$-1200 $V_p$. Here, the voltage fluctuation 10% of the inverter source voltage was added as a safety factor to the turn-to-turn voltage 910, and the enameled wire was used that satisfies the partial discharge voltage (CSV) of 1000 $V_p$. Then, the winding-to-core samples were produced as follows. Films 311 with various thicknesses were prepared that were made of polyester, polyimide, polyamide, polyethylene naphthalate, mica and glass cloth. The enameled wires 312 used for the motor windings were placed on this film. The silicone rubber mat 314 of 10-mm thickness for stress concentration reduction and insulating spacer was placed over the film and the enameled wires. These film, wires and rubber mat were sandwiched between the SUS flat plates of 5-mm thickness and tightened to press with bolts. Pulse voltages were applied to the produced samples, and the partial discharge inception voltages (CSV) were measured. The measured partial discharge inception voltages (CSV) were 1200-1800 $V_p$. Since the winding-to-core voltage was actually measured as 860 $V_p$, any of the films prepared has enough bearing force to that voltage. However, a voltage fluctuation may occur because the input side three-phase AC power source of the inverter is easy to be unbalanced, thus a sine-wave voltage being superimposed on the winding-to-core voltage. Thus, we allowed for the possibility that a voltage of the same level as that of the phase-to-phase voltage may be generated. That is, we employed the films that can withstand the voltage of 1250 $V_p$ resulting from being increased by the safety margin 10% of the phase-to-phase voltage 1140 $V_p$. The phase-to-phase insulation samples were produced as follows. Films 322 of various thicknesses as in the winding-to-core insulation samples were prepared that were made of polyester, polyimide, polyamide, polyethylene naphthalate, mica and glass cloth. This film was interposed between the enameled wires 321, and the silicone rubber mats, 324 for stress concentration reduction and insulating spacer were placed under and over the film and wires, respectively. These mats, film and wires were sandwiched between the SUS flat plates, 323, and tightened with bolts. Pulse voltages are applied to the prepared samples, and the partial discharge inception voltages (CSV) were measured. The measured partial discharge inception voltages (CSV) of the films were 1300-1800 $V_p$. Here, the voltage fluctuation 10% of the inverter source was added as a safety factor to the phase-to-phase voltage 1140 $V_p$, and the films were used that satisfy the partial discharge inception voltage (CSV) increased by 10% of 1140 $V_p$, or 1250 $V_p$. In step S405, motors were produced as samples with the decided insulation specification.

In step S406, we measured the partial discharge inception voltages (CSV) of the winding-to-core insulation, phase-to-phase insulation and turn-to-turn insulation of the motors produced for test.

Figure 5:
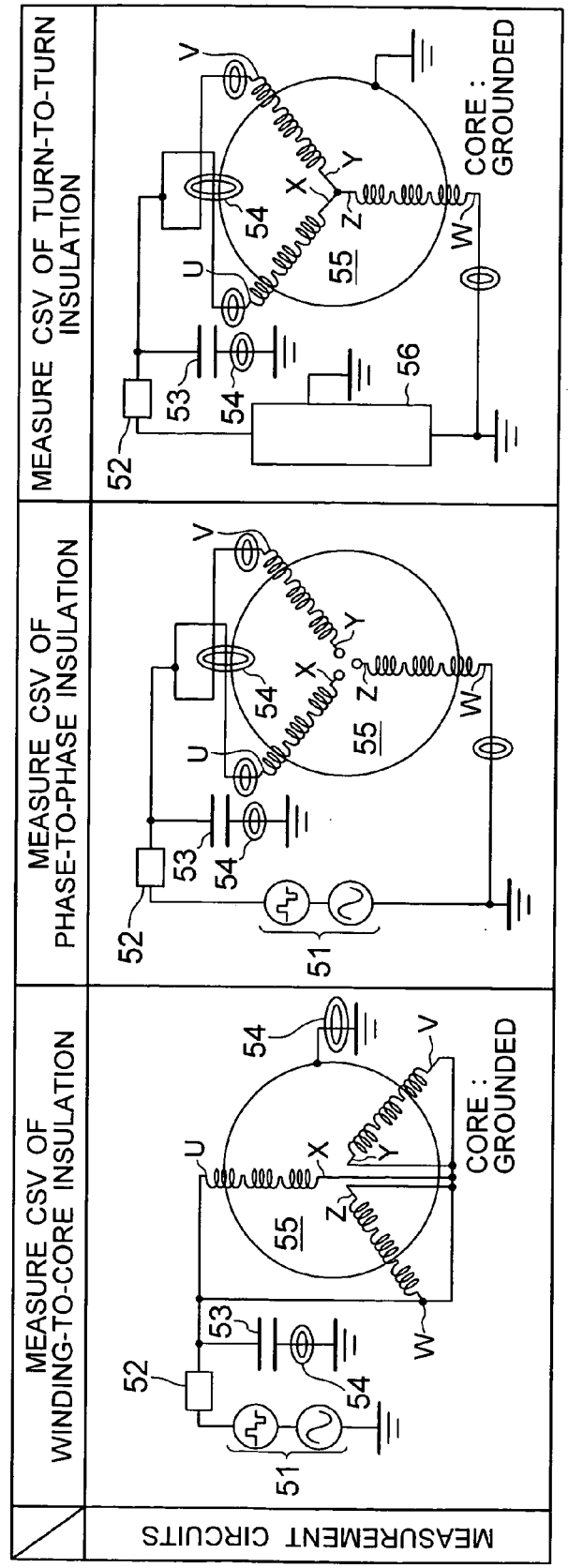
FIG. 5 is a diagram useful for explaining methods of measuring partial discharge inception voltages (CSV) of the insulating portions of motors under test.

FIG. 5 shows examples of the method of measuring Y-connection motors. That is, the partial discharge inception voltage (CSV) of the winding-to-core insulation was measured as follows. The connection points U, V, W, X, Y and Z of motor 55 were all connected together and connected to a test power source 51 through a blocking coil and a resistor 52. In addition, a motor core 25 was grounded, and pulse voltages were applied between the windings and the core so that the partial discharge inception voltages (CSV) were measured. The partial discharge was measured by high frequency CTs 54. The high frequency CTs 54 were cramped between a coupling capacitor 53 and the earth and between the core and the earth. The capacitor 53 makes up a closed circuit for the partial discharge current. The high frequency CTs 54 measured the partial discharge current and the partial discharge inception voltage (CSV) at the time of occurrence of partial discharge.

In step S407, we measured the partial discharge inception voltage (CSV) of the phase-to-phase insulation. The neutral point of the motor 55 was disconnected from the windings, and under this condition the U-phase winding and V-phase winding were connected to the test power source 51 through the blocking coil and resistor 52. In addition, the other W-phase winding was grounded, and pulse voltages were applied between the different phase windings of U-X/W-Z and between the different phase windings of V-Y/W-Z. The partial discharges were measured by the high frequency CTs 54. The high-frequency CTs 54 were cramped between the earth and the coupling capacitor 53 and the high voltage leads of test phases. The high frequency CTs 54 measured the partial discharge currents and the partial discharge inception voltage (CSV) at the time of occurrence of partial discharge. Under the same circuit connection, the V-phase winding and W-phase winding were connected to the test power source 51 through the blocking coil and resistor 52, and pulse voltages were applied between the different phase windings of V-Y/U-X. Then, the partial discharge inception voltage (CSV) between the different phases was measured.

In step S408, the partial discharge inception voltage (CSV) of the turn-to-turn insulation was measured. Under the condition in which the U-X, V-Y and W-Z windings were connected in Y-shape, the above partial discharge of the turn-to-turn insulation was measured. Specifically, as illustrated in FIG. 5, the U-phase winding and V-phase winding were connected to the pulse output terminal of a test power source 56 for turn-to-turn insulation through the blocking coil and resistor 52. The other W-phase winding was connected to the constant voltage output terminal of the test power source 56. The motor core 25 was grounded so that the voltage from the surge generator could be applied between the core and the U-phase and V-phase test windings. The rise time $t_r$ and fall time $t_f$ of the surge voltage from the surge generator and surge voltage waveform regulator of the test power source 56 for turn-to-turn measurement were made equal to the rise time $t_{r(p-c)m}=0.1$ μs of the surge voltage between the winding and core of the motor at the time of inverter drive. In addition, the pulse width $t_w$ was selected to be 10 μs, and the repetition frequency was 5 kHz, the same as the carrier frequency of the inverter. The partial discharges were measured by the high frequency CTs 54. The high-frequency CTs 54 were cramped at the coupling capacitor 53, the pulse voltage-applied lead wires of the test phase windings, and the constant voltage applied lead wire. Under this condition, the high frequency CTs 54 measured the partial discharge currents and the partial discharge inception voltage (CSV) at the time of occurrence of partial discharge.

In step S409, the insulation specification was decided. Consequently, the partial discharge inception voltages (CSV) between the winding and the core, between the different phases, and between the winding turns were respectively measured as 1300 $V_p$, 1340 $V_p$, and 1310 $V_p$ irrespective of whether the varnish treatment was carried out. The voltages across those insulating portions in the motor fed by inverter were 860 $V_p$, 1140 $V_p$ and 1140 $V_p$, respectively. If we consider the safety factor to the voltage fluctuation and power source unbalance, the partial discharge inception voltages (CSV) of the winding-to-core, phase-to-phase and turn-to-turn insulation must satisfy the target values, 1250 $V_p$, 1250 $V_p$ and 1250$V_p$, respectively. Therefore, the partial discharge inception voltages (CSV) of the produced motors achieved the target voltages, respectively. Thus, by employing the method of designing the insulation of motor, it is possible to decide the insulation design and specification of the motor suitable for the inverter drive.

The above-mentioned insulation design showed the method of deciding the specification of insulation between the winding and the core, between the phases and between the winding turns of the motor fed by inverter. However, even under the line voltage drive, a relatively high voltage is applied between the winding and the core, and between the phases of the motor. Thus, many insulation designs and much examination data about these insulating portions have so far been proposed. The insulation design can be sometimes performed by using the existing design information even without the above examination. In such case, only the design of the insulation between the winding turns can be made and used for the insulation design of the motor fed by inverter. In addition, samples of motor were produced by using the insulation characteristics of model samples as the base. However, as described below, production of motor samples from the very beginning is sometimes efficient in that the insulation characteristics can be examined by considering the machine failure at the time of production.

Figure 6:
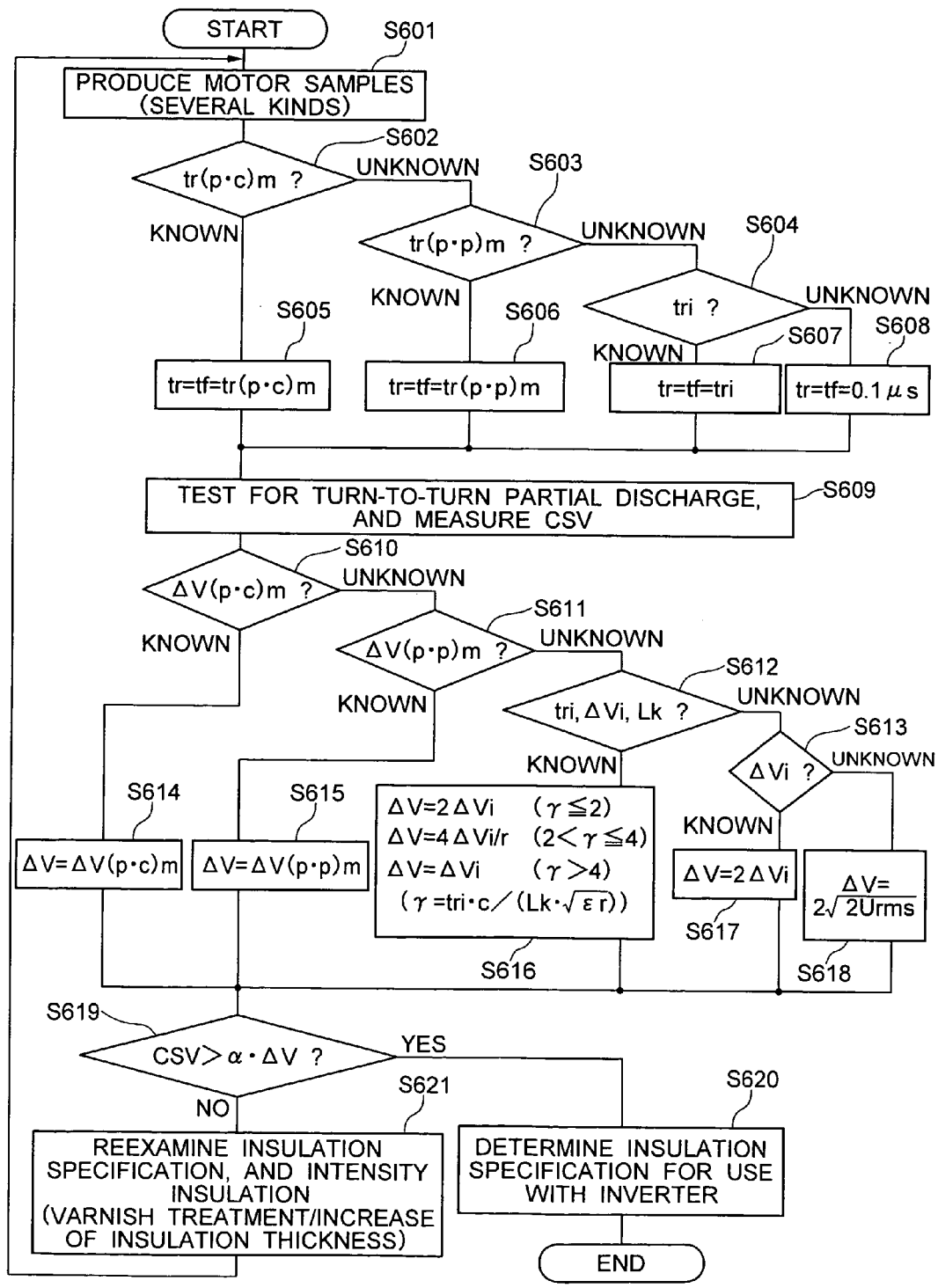
FIG. 6 is a diagram useful for explaining the matching of the turn-to-turn insulation specification to the motor fed by inverter.

Another method for determining the insulation specification between the winding turns will be described with reference to FIG. 6. In this embodiment, the motor samples are produced and then the insulation specification between the winding turns is determined. In step S601, several kinds of motor samples are produced according to the selected ones of the insulation specifications for the motor fed by inverter. Then, in steps S602-S608, the rise time $t_r$ of the output voltages from the surge generator 1 and surge voltage waveform regulator 4 is set to be equal to the fall time $t_f$ of the output voltages. When the rise time $t_{r(p-c)m}$ of the surge voltage applied between the winding and the core at the motor terminal is known, it is used as the rise time $t_r$. When the rise time $t_{r(p-p)m}$ of the surge voltage applied between the phases is known, it is used as the rise time $t_r$. If these values are not known, the rise time of about 0.1 μs observed in the 600-V or 1200-V class IGBT inverter is employed as the rise time $t_r$.

In step S609, the partial discharge and partial discharge inception voltage (CSV) between the winding turns are measured. In steps S602-S608, the transient step of surge voltage $\Delta V$ at the motor terminal is set. If the steep-fronted voltage $\Delta V_{(p-c)m}$ is obtained between the winding and the core at the motor terminal at the time of inverter drive, it is used as the transient step of surge voltage $\Delta V$ of the motor terminal. When the steep-fronted voltage $\Delta V_{(p-p)m}$ between the phases is obtained, it is used as the transient step of surge voltage $\Delta V$ at the motor terminal. When the rise time $t_{ri}$ of the surge voltage at the inverter end, the transient step of surge voltage $\Delta V_i$ at the inverter end, and the length $L_k$ of the cable between the inverter and the motor are known, the transient step of surge voltage $\Delta V$ at the motor terminal is estimated by the following equations.

$$\Delta V = 2\Delta V_i \ (\Delta \leq 2)$$

$$\Delta V = 4\Delta V_i/\gamma \ (2 < \gamma \leq 4)$$

$$\Delta V = \gamma V_i \ (\gamma > 4)$$

$$(\gamma = t_{ri} \cdot c/(L_k \sqrt{\varepsilon_r}))$$

When the variables of these equations are unknown, the transient step of surge voltage $\Delta V$ at the motor terminal is selected to be twice the steep-fronted voltage $\Delta V_i$ at the inverter terminal. Alternatively, the transient step of surge voltage $\Delta V$ at the motor terminal is selected to be the transient step of surge voltage $2\sqrt{2U_{rms}}$ imagined from the inverter rated voltage $U_{rms}$.

In step S619, the measured partial discharge inception voltage (CSV) is compared to the transient voltage step of surge at motor terminal $\Delta V$ multiplied by a safety factor α, or $\alpha \Delta V$. If the partial discharge inception voltage (CSV) is larger than the voltage $\alpha \Delta V$, the program goes to step S620, where the insulation specification is decided for the inverter. If the partial discharge inception voltage (CSV) is not larger than the voltage $\alpha \Delta V$, the program goes to step S621, where the insulation specification is reexamined, or the insulation is intensified by increasing the thickness of the varnish and the turn-to-turn insulating portion. Then, the program goes back to step S601. Thus, the insulation system of the motor fed by inverter can be designed with ease.

Figure 7:
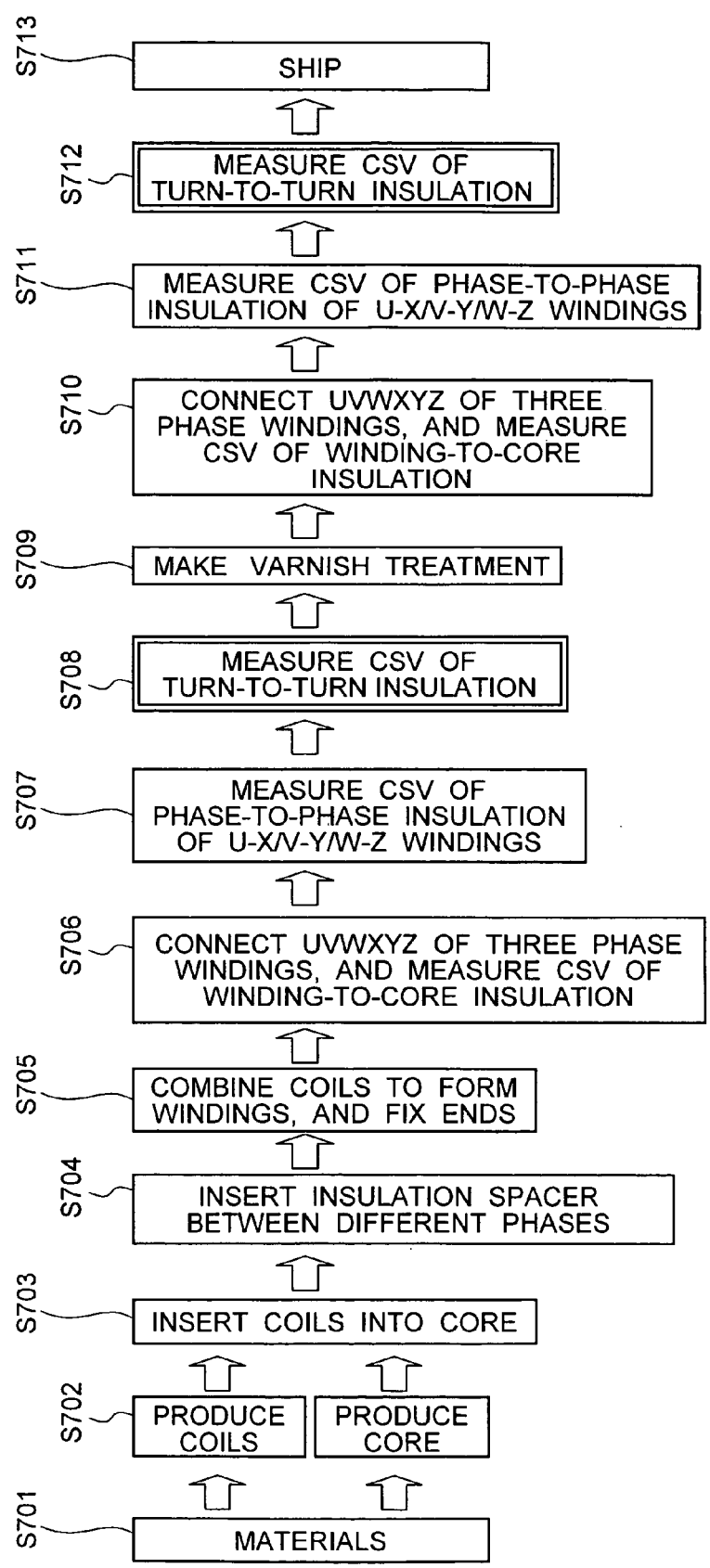
FIG. 7 is a diagram useful for explaining the methods for manufacturing and inspecting motors fed by inverter before the shipment.
Figure 10:
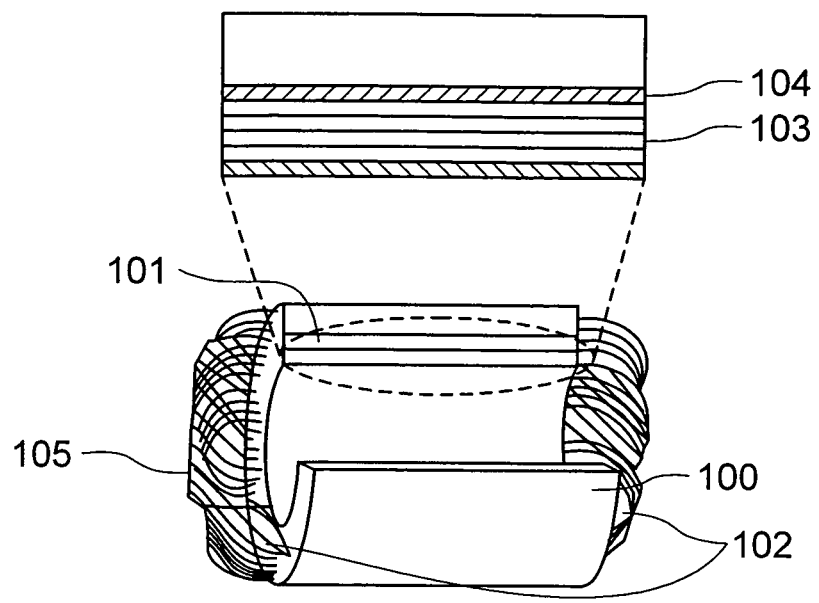
FIG. 10 is a schematic diagram of the motor's stator windings and insulation structure.

FIG. 7 shows a method of actually producing and inspecting the motors designed after examining the insulation specification for the inverter drive, confirming if each product is able to work as the insulation system for the inverter drive, and shipping the products. In addition, FIG. 10 shows the schematic view of the stator's insulation structure of a low-voltage motor actually produced. In step S701, selection and preparation are made of electromagnetic steel sheets for the core of motor's stator, bobbins, enamel or glass for the windings, wires insulated with film, insulating films for the winding-to-core and phase-to-phase insulation, and materials of spacer, tube, tape, binding wire and varnish. In step S702, the coiled windings and stator's core are produced. Specifically, the coiled windings 103 and stator's core 100 are produced. In step S703, the produced coiled windings are mounted in the stator's coil slot in which the slot insulation for insulating the windings and the core is previously inserted. In step S704, the insulating spacer is inserted between the different phase windings at the coil ends where the windings projected to the outside from the stator's core come into contact. Specifically, the winding 104 is mounted in the slot 101 in which the slot insulation is previously inserted, and the insulating film 105 is inserted between the different phase windings at the coil ends 102 as illustrated in FIG. 10. In step S705, although not shown in FIG. 10, a plurality of coiled windings inserted in the stator's core are connected in series or parallel by the remaining or spanning wire, thereby making up one-phase motor winding. The spanning wire is clad with an insulating material such as an insulating tube, or wound with insulating tape. The coil ends are fixed by binding with heat-resistant binding wire not shown so that the motor windings cannot be vibrated during the operation.

In step S706, the winding's U, V, W, X, Y and Z points of the produced motor are first connected together before varnish treatment, pulse voltages are applied between the winding and the core, and the partial discharge inception voltages (CSV) are measured. In step S707, under the condition that the neutral point of the motor is disconnected, pulse voltages are applied between the different phase windings of U-X/V-Y/W-Z windings, and the partial discharge inception voltages (CSV) are measured. In step S708, finally under the condition that the U-X, V-Y and W-Z windings are connected in Y-shape, the turn-to-turn partial discharges are measured according to the invention. Specifically, the discharges were detected by the circuit shown in FIG. 5 as when the insulation of the motor fed by inverter was examined as above. The partial discharge inception voltages (CSV) of the winding-to-core insulation, phase-to-phase insulation and turn-to-turn insulation are multiplied by an increasing rate β=1 of partial discharge inception voltage (CSV) involved in the varnish treatment. Consequently, any one of the five test motors satisfied the target voltage of the motor fed by inverter insulation system. In other words, any motor of assumed 400-$V_{rms}$ class motors fed by inverter satisfied the target values of 1250 $V_p$, 1250 $V_p$ and 1250 $V_p$ between the winding and the core, between the different phase windings, and between the winding turns.

In step S709, the motor's stator produced by the above method is treated with varnish by dropping, coating, spraying or immersing the whole stator windings. Specifically, in the embodiment 1, varnish treatment was performed by evacuating a vacuum drying oven in which the motor is previously placed, and then injecting varnish into the epoxy resin. The motor windings processed with varnish was taken out from the vacuum oven, appropriately dried in an oven, cured according to a predetermined hardening schedule, and taken out from the oven.

In steps S710, S711 and S712, the motor after the varnish treatment was placed under the partial discharge measurement in the same way as was the motor windings before the varnish treatment, and the partial discharge inception voltage (CSV) of each insulating portion was measured. From the comparison of the measured partial discharge inception voltages (CSV) and the target voltages, it was found that the measured values between the winding and the core, between the different phases and between the winding turns satisfied the target values 1250 $V_p$, 1250 $V_p$, 1250 $V_p$, respectively. In step S713, the produced stator was securely fitted in the frame by heating, combined with the rotor, and subjected to certain tests for electrical, mechanical, heat and rotational characteristics, and then the product was shipped.

In the comparison of the measured partial discharge inception voltages (CSV) and the target voltages, if the former was lower than the latter, the motor was judged to reject as a motor fed by inverter, and it was not shipped. In addition, the failed product was again subjected to an additional insulating process such as varnish treatment, and then placed under the measurement for the partial discharge inception voltages (CSV). If the renewed product again did not satisfied the characteristics even after the above additional treatment, it was discarded as a defective. Thus, by employing the method for manufacturing and inspecting the motor insulation according to the invention, it is possible to determine the insulation design and specification of the motor suitable for inverter drive.

The above method for manufacturing and inspecting the insulation showed all the cases of producing and inspecting the insulating regions of the winding-to-core insulation, phase-to-phase insulation and turn-to-turn insulation of the motor fed by inverter. However, even at the time of line voltage drive, a relatively high voltage is applied between the winding and the core and between the different phases. Therefore, many insulation designs and much examination data about these insulating portions have so far been proposed. The sufficiently long life can be sometimes expected by using the existing past record even without the above examination. In such case, only the test of the turn-to-turn insulation can be performed enough for the production and inspection of the inverter drive motor.

Figure 8:
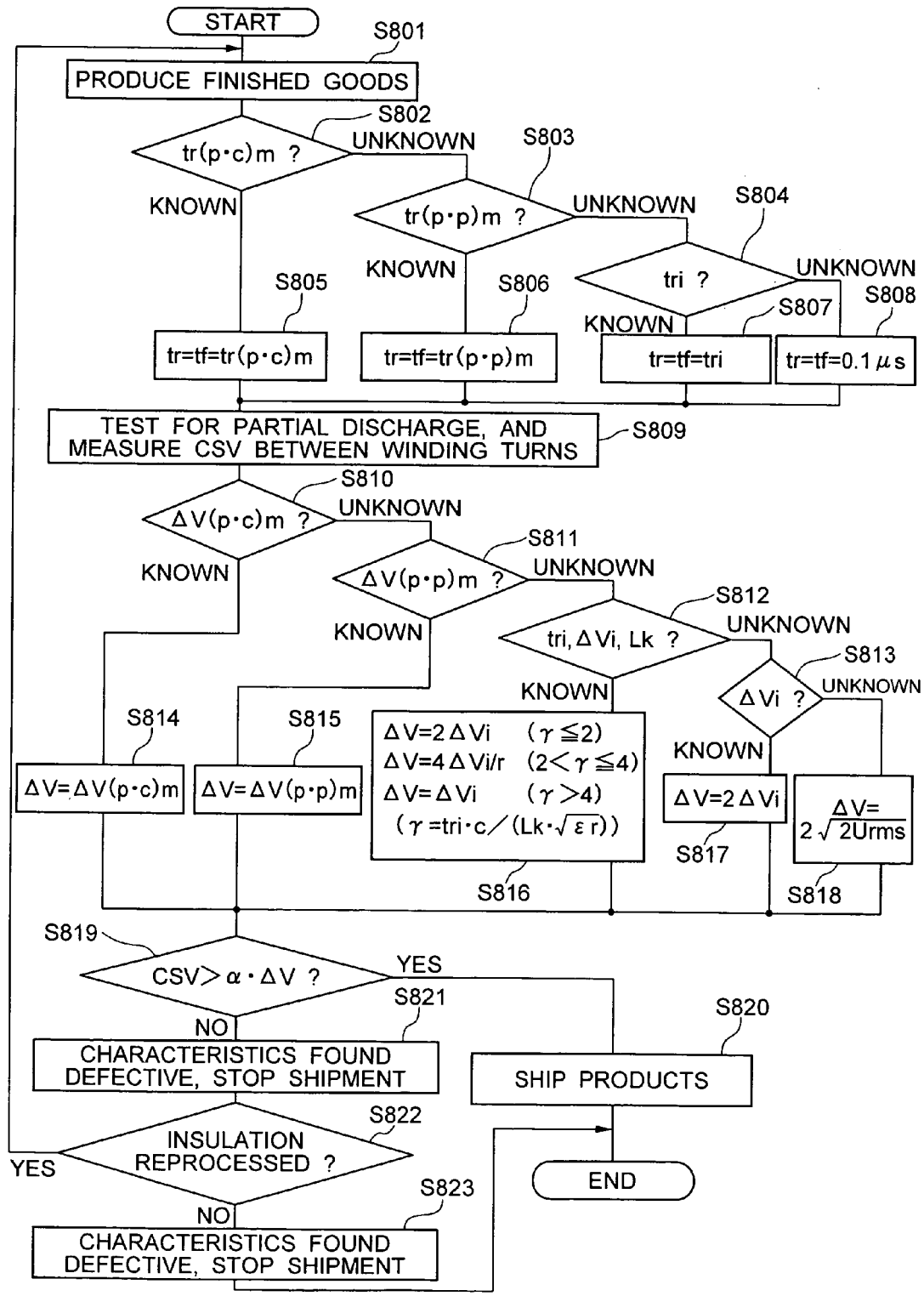
FIG. 8 is a diagram useful for explaining the method of inspecting the turn-to-turn insulation of motor fed by inverter before the shipment.

Another method for inspecting the insulation between the winding turns will be described with reference to FIG. 8. This example shows a method contrived according to the previous method for producing and inspecting the insulation of the motor between the winding and the core, the insulation between the different phases and the insulation between the winding turns. FIG. 8 shows a flowchart of this method. In step S801, a motor is produced according to the proposed ones of the insulation specifications of the motor fed by inverter. Steps S802-S819 are the same as the steps S602-S619 shown in FIG. 6. In step S619, the partial discharge inception voltage (CSV) is compared with the transient voltage step of surge at motor terminal ΔV multiplied by the safety factor α, or αΔV. If the partial discharge inception voltage (CSV) is larger than the value αΔV, the program goes to step S820, where the product is shipped. If the partial discharge inception voltage (CSV) is not larger than the value αΔV, the program goes to step S821, where the product is judged to be defective in the characteristics and failed so that it cannot be shipped. In step S822, the rejected article is again subjected to insulating treatment such as varnish treatment. Then, the program goes back to step S801. For the other cases, in step S823, the rejected product is discarded as a defective article.

FIG. 14A shows an embodiment 2 of the detecting apparatus according to the invention. In the embodiment 1 shown in FIG. 1, the non-tested phase 24 of the test motor 2 was connected to the negative-polarity constant voltage output terminal 28 of the surge generator. In this embodiment 2, the non-tested phase 24 is connected to the positive-polarity constant voltage output terminal, 141 of the surge generator 1. At the surge voltage output terminal, 142 is produced the surge voltage to the ground that changes between the values of E/2 and −E/2 as shown in FIG. 14B on the lower right side. Since the motor core 25 is grounded, the surge voltage to the ground is directly applied between the core and the tested phase windings.

Figure 19:
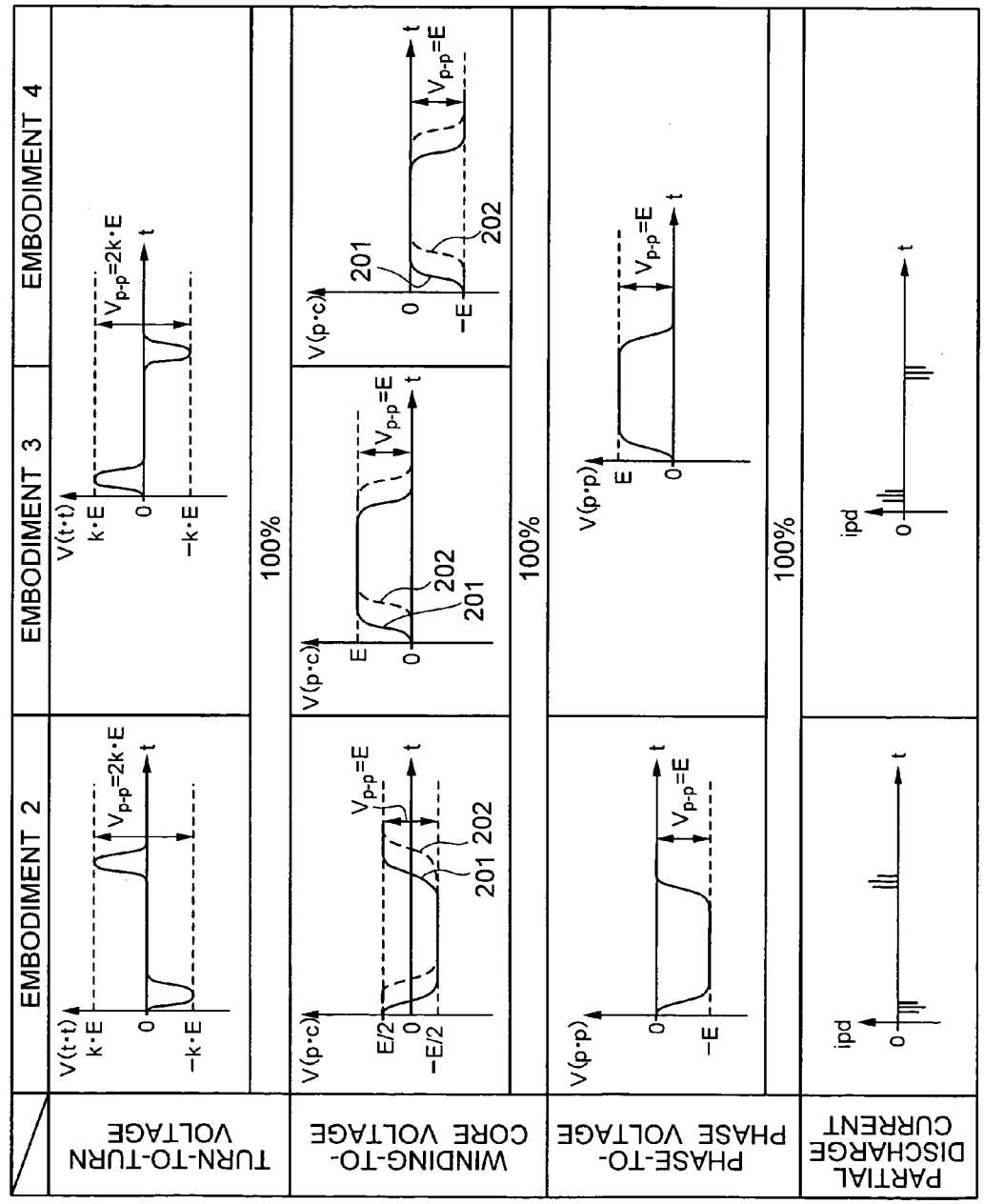
FIG. 19 is a diagram showing the waveforms of the winding-to-core voltage, phase-to-phase voltage and partial discharge current with the distributed turn-to-turn voltage made constant in the embodiments 2 through 4.

FIG. 19 shows the waveforms of the turn-to-turn voltage, winding-to-core voltage, phase-to-phase voltage and partial discharge current measured when the partial discharge is caused with the use of the detecting apparatus of the embodiment 2. The rise time and fall time of the surge voltage between the winding and the core were selected to be 0.1 μs. The pulse width of the constant voltage E/2 was 10 μs. The winding-to-core voltages shown in FIG. 19 include a voltage waveform 201 measured at the voltage-applied portion of the tested phase winding, and a voltage waveform 202 measured at part of the winding turns. Even in the embodiment 2, partial discharge currents were observed when voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 2 can precisely measure the partial discharges between the winding turns.

FIG. 29 shows the voltages applied to the insulating portions when the motor is tested by the detecting apparatus of the embodiment 2. Even in the embodiment 2, the voltage across the turn-to-turn insulation was higher than the partial discharge inception voltage (CSV) measured in the elemental model. Thus, it can be considered that a partial discharge occurred between the winding turns. On the other hand, since the voltages across the winding-to-core insulation and across the phase-to-phase insulation are about ½ the partial discharge inception voltage (CSV) measured in the elemental models, it can be considered that no partial discharge occurred in those insulating portions. Therefore, it is clear that even the detecting apparatus of the embodiment 2 can efficiently apply the voltage between the winding turns and accurately detect the partial discharge occurring between the winding turns.

FIG. 15A shows the embodiment 3 of the detecting apparatus according to the invention. In the embodiment 1 shown in FIG. 1, the intermediate point 17 between the DC capacitors 12 and 13 was grounded. On the contrary, in the embodiment 3, the lower arm 18 and the constant voltage output terminal, 152 are grounded. Thus, as shown in FIG. 15B on the upper right side, the surge voltage to the ground that changes between 0 and E is produced at the surge voltage output terminal, 151. Since the motor core 25 is grounded, the surge voltage to the ground is directly applied between the tested phase windings and the core. In the embodiment 3, since the lower arm 18 is grounded and a diode bridge is used for the rectifying circuit 152 of the surge generator, an insulating slide transformer 151 is connected to the input side.

FIG. 19 shows the waveforms of the turn-to-turn voltage, winding-to-core voltage, phase-to-phase voltage and partial discharge current measured when the partial discharge is caused with the use of the detecting apparatus of the embodiment 3. Even in the embodiment 3, partial discharge currents were observed when the voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 3 can precisely measure the partial discharge between the winding turns.

FIG. 29 shows the voltages applied to the insulating portions when the motor is tested by the detecting apparatus of the embodiment 3. Even in the embodiment 3, the voltage across the turn-to-turn insulation was higher than the partial discharge inception voltage (CSV) measured in the elemental model. Thus, it can be considered that a partial discharge occurred between the winding turns. On the other hand, since the voltages across the winding-to-core insulation and across the phase-to-phase insulation are about ½ the partial discharge inception voltages (CSV) measured in the elemental models, it can be considered that no partial discharge occurred in those insulating portions. Therefore, it is clear that even the detecting apparatus of the embodiment 3 can efficiently apply the voltage between the winding turns and accurately measure the partial discharge occurring between the winding turns.

FIG. 16A shows the embodiment 4 of the detecting apparatus according to the invention. In the embodiment 3 shown in FIG. 15, the lower arm 18 and the constant voltage output terminal 152 were grounded. On the other hand, in the embodiment 4, the upper arm 16 is grounded. Thus, the surge voltage to the ground that changes between −E and 0 is produced at the surge output terminal, 161 as shown in FIG. 16B on the upper right side. Since the motor core 25 is grounded, the surge voltage to the ground is directly applied between the tested phase windings and the core.

FIG. 19 shows the waveforms of the turn-to-turn voltage, winding-to-core voltage, phase-to-phase voltage and partial discharge current measured when the partial discharge is caused with the use of the detecting apparatus of the embodiment 4. Even in the embodiment 4, partial discharge currents were observed when the voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 4 can precisely measure the partial discharge between the winding turns.

FIG. 29 shows the voltages applied to the insulating portions when the motor is tested by the detecting apparatus of the embodiment 4. Even in the embodiment 4, the voltage across the turn-to-turn insulation was higher than the partial discharge inception voltage (CSV) measured in the elemental model. Thus, it can be considered that a partial discharge occurred between the winding turns. On the other hand, since the voltages across the winding-to-core insulation and across the phase-to-phase insulation are about ½ the partial discharge inception voltages (CSV) measured in the elemental models, it can be considered that no partial discharge occurred in those insulating portions. Therefore, it is clear that even the detecting apparatus of the embodiment 4 can efficiently apply the voltage between the winding turns and accurately measure the partial discharge occurring between the winding turns.

FIG. 17A shows the embodiment 5 of the detecting apparatus according to the invention. In the embodiment 5 shown in FIG. 17A, the lower arm 18 and the constant voltage output terminal, 172 are grounded as in the embodiment 3 shown in FIG. 15A. Thus, the surge voltage to the ground that changes between E and 0 is produced at the surge output terminal 5 like the voltage applied in the embodiment 3. However, in the embodiment 5, an offset voltage of E/2 with its negative electrode grounded is applied to the motor core 25. Thus, the surge voltage that changes between −E/2 and E/2 is applied between the tested phase windings and the core as shown in FIG. 17B on the upper right side.

Figure 21:
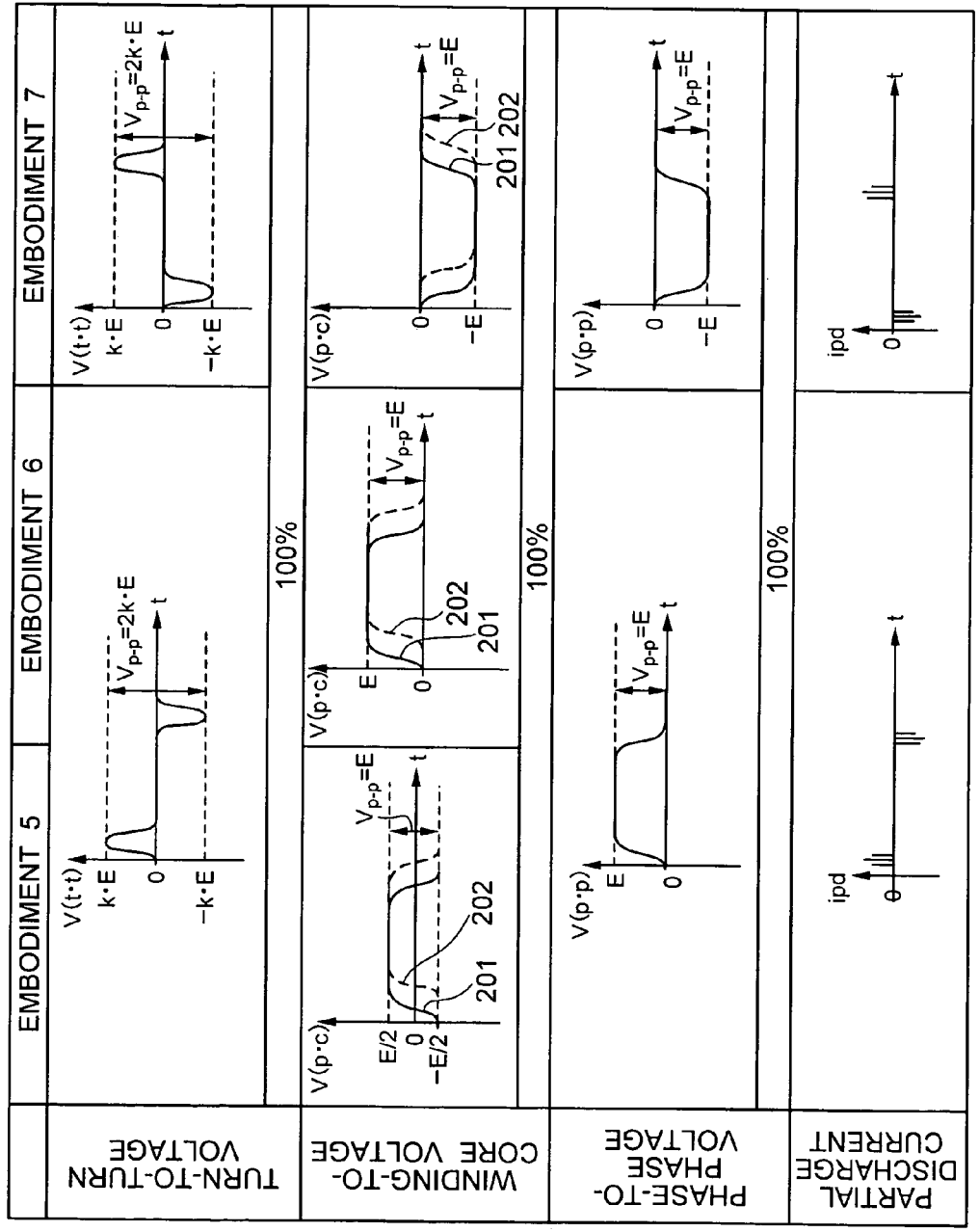
FIG. 21 is a diagram showing the waveforms of the winding-to-core voltage, phase-to-phase voltage and partial discharge current with the turn-to-turn voltage made constant in the embodiments 5 through 7.

FIG. 21 shows the waveforms of the turn-to-turn voltage, winding-to-core voltage, phase-to-phase voltage and partial discharge current measured when the partial discharge is caused with the use of the detecting apparatus of the embodiment 5. Even in the embodiment 5, partial discharge currents were observed when the voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 5 can precisely measure the partial discharge between the winding turns.

FIG. 29 shows the voltages applied to the insulating portions when the motor is tested by the detecting apparatus of the embodiment 5. Even in the embodiment 5, the voltage across the turn-to-turn insulation was higher than the partial discharge inception voltage (CSV) measured in the elemental model. Thus, it can be considered that partial discharges occurred between the winding turns. On the other hand, since the voltages across the winding-to-core insulation and across the phase-to-phase insulation are about ½ the partial discharge inception voltages (CSV) measured in the elemental models, it can be considered that no partial discharge occurred in those insulating portions. Therefore, it is clear that even the detecting apparatus of the embodiment 5 can efficiently apply the voltage between the winding turns and accurately measure the partial discharge occurring between the winding turns.

FIG. 18A shows the embodiment 6 of the detecting apparatus according to the invention. In the embodiments 1 through 5, the DC current charged the capacitor, and the surge voltage was produced by switching this charged capacitor. However, in the embodiment 6, the DC current is produced by the rectifying circuit 152, a DC smoothing/overcurrent-detecting element 187 and a capacitor 188, and supplied through a resistor 186 to the core wire of a coaxial cable 182, thus charging it. The surge voltage is developed across a load resistor 185 by turning on a switch 183 such as IGBT, MOSFET, ball gap, thyratron or mercury relay, and supplied from a surge voltage output terminal 189 through the surge voltage waveform regulator 4 to the test motor 2. Thus, as shown in FIG. 18B on the upper right side, the surge voltage to the ground that changes between 0 and E is generated across the load resistor 185. Since the motor core 25 is grounded, the surge voltage to the ground is directly applied between the tested phase windings and the core.

In the circuit arrangement of embodiment 6, the load resistor 185 equal to the surge impedance of the coaxial cable 182 must be connected to the coaxial cable 182 in order to make the impedance matching. On the opposite side of the coaxial cable to the load resistor, it is necessary to connect the resistor 186 of which the value is larger than the surge impedance of the coaxial cable 182. Since the width of the produced surge is determined by the time lapse in which the surge voltage goes forward and backward on the coaxial cable 182 when the switch 183 is turned on, the pulse width of the surge voltage can be changed by adjusting the length of the coaxial cable 182. In addition, the coaxial cable 182 can be replaced by an LC network circuit.

FIG. 21 shows the waveforms of the turn-to-turn voltage, winding-to-core voltage, phase-to-phase voltage and partial discharge current measured when the partial discharge is caused with the use of the detecting apparatus of the embodiment 6. Even in the embodiment 6, partial discharge currents were observed when the voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 6 can precisely detect the partial discharge between the winding turns.

FIG. 29 shows the voltages applied to the insulating portions when the motor is tested by the detecting apparatus of the embodiment 6. Even in the embodiment 6, the voltage across the turn-to-turn insulation was higher than the partial discharge inception voltage (CSV) measured in the elemental model. Thus, it can be considered that a partial discharge occurred between the winding turns. On the other hand, since the voltages across the winding-to-core insulation and across the phase-to-phase insulation are about ½ the partial discharge inception voltages (CSV) measured in the elemental models, it can be considered that no partial discharge occurred in those insulating portions. Therefore, it is clear that even the detecting apparatus of the embodiment 6 can efficiently apply the voltage between the winding turns and accurately measure the partial discharge occurring between the winding turns.

FIG. 20A shows an embodiment 7 of the detecting apparatus according to the invention. In the embodiment 7, the DC current is generated by using the connection of the rectifying circuit 152, a DC smoothing/overcurrent-detecting element 2007 and a capacitor 2008. The DC current is caused to flow through a resistor 2006, charging the sheath of a coaxial cable 2002. When a switch 2003 connected to the sheath of the coaxial cable is turned on, the surge voltage is developed across a load resistor 2005. The developed surge voltage is applied from a surge voltage output terminal 2009 through the surge voltage waveform regulator 4 to the test motor 2. Thus, the surge voltage to the ground that changes between 0 and –E as shown in FIG. 20B on the upper right side is developed across the load resistor 2005. Since the motor core 25 is grounded, the surge voltage to the ground is directly applied between the tested phase windings and the core.

In the circuit arrangement of embodiment 7, the load resistor 2005 equal to the surge impedance of the coaxial cable 2002 must be connected to the coaxial cable 2002 in order to make the impedance matching. On the other hand, it is necessary to open the terminal end, 2004 of the coaxial cable or to connect at the terminal end a resistor that is larger than the surge impedance of the coaxial cable 2002. Since the width of the surge-voltage is determined by the time in which the surge voltage goes forward and backward on the coaxial cable 2002 when the switch 2003 is turned on, the pulse width of the surge voltage can be changed by adjusting the length of the coaxial cable 2002. The coaxial cable 2002 can be replaced by an LC network circuit.

FIG. 21 shows the waveforms of the turn-to-turn voltage, winding-to-core voltage, phase-to-phase voltage and partial discharge current measured when the partial discharge is caused with the use of the detecting apparatus of the embodiment 7. Even in the embodiment 7, partial discharge currents were observed when the voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 7 can precisely measure the partial discharge between the winding turns.

FIG. 29 shows the voltages applied to the insulating portions when the motor is tested by the detecting apparatus of the embodiment 7. Even in the embodiment 7, the voltage across the turn-to-turn insulation was higher than the partial discharge inception voltage (CSV) measured in the elemental model. Thus, it can be considered that a partial discharge occurred between the winding turns. On the other hand, since the voltages across the winding-to-core insulation and across the phase-to-phase insulation are about ½ the partial discharge inception voltages (CSV) measured in the elemental models, it can be considered that no partial discharge occurred in those insulating portions. Therefore, it is clear that even the detecting apparatus of the embodiment 7 can efficiently apply the voltage between the winding turns and accurately measure the partial discharge occurring between the winding turns.

FIG. 22 shows an embodiment 8 of the detecting apparatus according to the invention. The embodiment 8 is different from the embodiment 6 shown in FIG. 18 in that a switch 221 is connected in parallel to the load resistor 185. The other portions are the same as in the embodiment 6.

In the embodiment 6 shown in FIG. 18 and the embodiment 7 shown in FIG. 20, the switches 183, 2003 were turned on, allowing the electric charges accumulated on the coaxial cables 182, 2002 to flow through the load resistors 185, 2005, thus the surge voltage being developed across the loads. In addition, the pulse width was determined by changing the length of the coaxial cable 182, 2002. Moreover, the first voltage change of the surge voltage, namely the voltage rise time in the embodiment 6 or the voltage fall time in the embodiment 7 was determined by the turn-on time of the switch 183, 2003. However, the next voltage change of the surge voltage, namely the voltage fall time in the embodiment 6 or the voltage rise time in the embodiment 7 depends on the waveform of the surge voltage that is returned after being generated when the switch 183, 2003 is turned on, and being propagated through the coaxial cable. In other words, use of the coaxial cable or LC circuit having a high-frequency transmission loss will make the surge voltage reduced. As a result there is the possibility that the next voltage change of the surge voltage to be applied to the motor, namely the voltage fall time in the embodiment 6 or the voltage rise time in the embodiment 7 becomes slow, or long.

Thus, in the embodiment 8, the switch 221 is turned on when the surge voltage shown in FIG. 22B falls, so that the rise time and fall time can coincide with each other. Thus, the voltage to the ground that changes between 0 and E as shown in FIG. 22B on the upper right side is developed across the load resistor 185. Since the motor core 25 is grounded, the surge voltage to the ground generated at a surge output terminal 220 is directly applied between the tested phase windings and the core.

Figure 25:
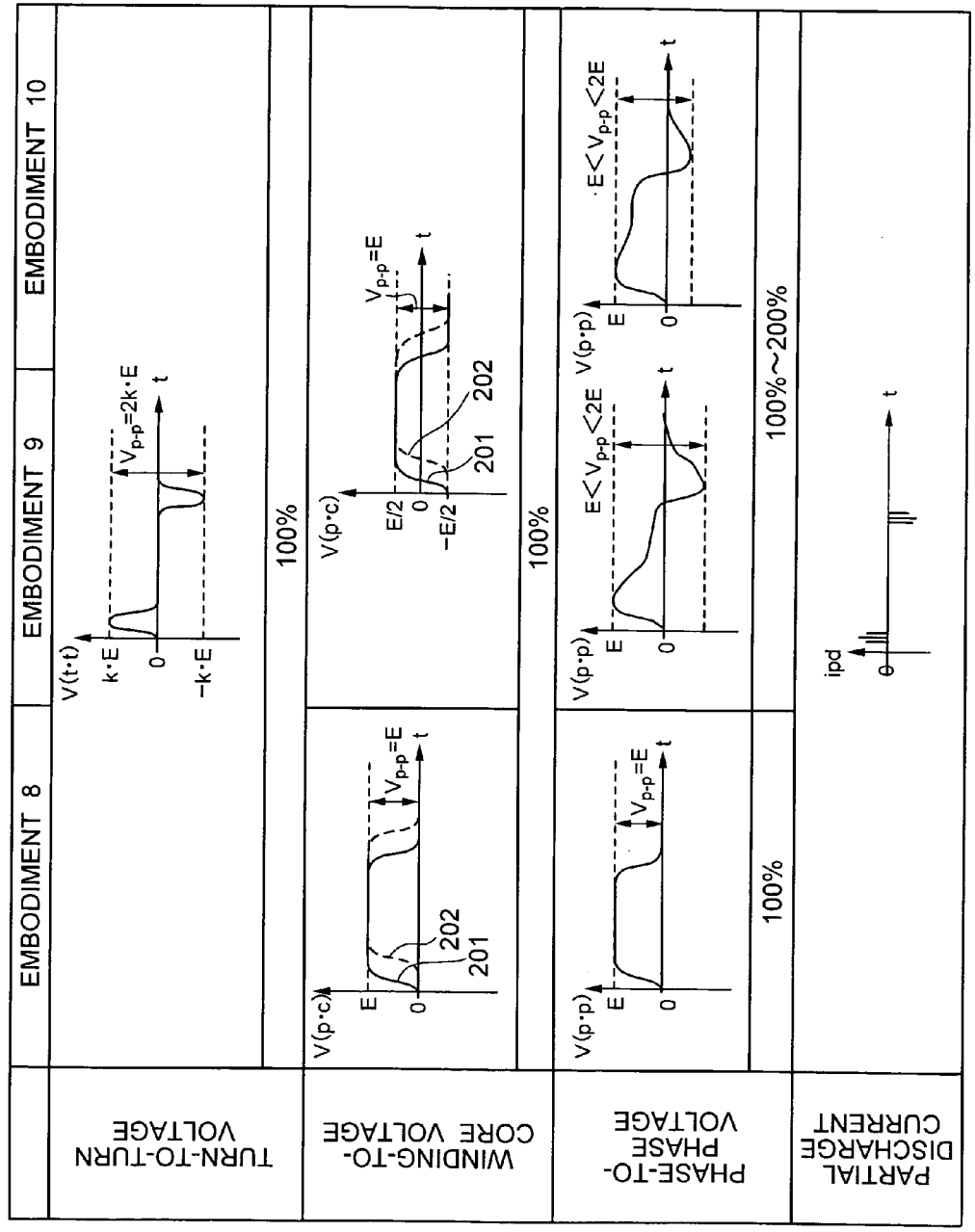
FIG. 25 is a diagram showing the waveforms of the winding-to-core voltage, phase-to-phase voltage and partial discharge current with the turn-to-turn voltage made constant in the embodiments 8 through 10.

FIG. 25 shows the waveforms of the turn-to-turn voltage, winding-to-core voltage, phase-to-phase voltage and partial discharge current measured when the partial discharge is caused with the use of the detecting apparatus of the embodiment 8. Even in the embodiment 8, partial discharge currents were observed when voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 8 can precisely measure the partial discharge between the winding turns.

FIG. 29 shows the voltages applied to the insulating portions when the motor is tested by the detecting apparatus of the embodiment 8. Even in the embodiment 8, the voltage across the turn-to-turn insulation was higher than the partial discharge inception voltage (CSV) measured in the elemental model. Thus, it can be considered that a partial discharge occurred between the winding turns. On the other hand, since the voltages across the winding-to-core insulation and across the phase-to-phase insulation are about ½ the partial discharge inception voltages (CSV) measured in the elemental models, it can be considered that no partial discharge occurred in those insulating portions. Therefore, it is clear that even the detecting apparatus of the embodiment 8 can efficiently apply the voltage between the winding turns and accurately measure the partial discharge occurring between the winding turns.

FIG. 23A shows an embodiment 9 of the detecting apparatus according to the invention. The surge generator 1 of the detecting apparatus of the embodiment 9 is the same as that of FIG. 1. Thus, the surge voltage to the ground that changes between $-E/2$ and $E/2$ as shown in FIG. 23B on the upper right side is produced at a surge output terminal 232. In addition, since the motor core is grounded, the surge voltage to the ground is directly applied between the tested phase windings and the core. However, although the non-tested phase 24 of the test motor in the embodiment 1 is connected to the constant voltage output terminal 28 of the surge generator 1, the non-tested phase 24 of the test motor in the embodiment 9 is floated in potential through a gap or insulator 233.

FIG. 25 shows the waveforms of the turn-to-turn voltage, winding-to-core voltage, phase-to-phase voltage and partial discharge current measured when the partial discharge is caused with the use of the detecting apparatus of the embodiment 9. Even in the embodiment 9, partial discharge currents were observed when voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 9 can precisely detect the partial discharge between the winding turns. In the embodiment 9, since part of the surge voltage was propagated to the non-tested phase by the capacitive coupling through the lead wire, the peak of the voltage between the different phases was reduced to less than 2 E.

FIG. 31 shows the voltages applied to the insulating portions when the motor is tested by the detecting apparatus of the embodiment 9. Even in the embodiment 9, the voltage across the turn-to-turn insulation was higher than the partial discharge inception voltage (CSV) measured in the elemental model. Thus, it can be considered that a partial discharge occurred between the winding turns. On the other hand, since the voltages across the winding-to-core insulation and across the phase-to-phase insulation are about ½ the partial discharge inception voltages (CSV) measured in the elemental models, it can be considered that no partial discharge occurred in those insulating portions. Therefore, it is clear that even the detecting apparatus of the embodiment 9 can efficiently apply the voltage between the winding turns and accurately detect the partial discharge occurring between the winding turns.

FIG. 24 shows an embodiment 10 of the measuring apparatus according to the invention. The surge generator 1 of the detecting apparatus of the embodiment 10 is the same as that of the embodiment 1. Thus, the surge voltage to the ground that changes between $-E/2$ and $E/2$ as shown in FIG. 24B on the upper right side is produced at a surge output terminal 240. In addition, since the motor core 25 is grounded, the surge voltage to the ground is directly applied between the tested phase windings and the core. However, although the non-tested phase 24 of the test motor 2 in the embodiment 1 is connected to the constant voltage output terminal 28 of the surge generator 1, the non-tested phase 24 of the test motor 2 in the embodiment 10 is grounded through a resistor.

FIG. 25 shows the waveforms of the turn-to-turn voltage, winding-to-core voltage, phase-to-phase voltage and partial discharge current measured when the partial discharge is caused with the use of the detecting apparatus of the embodiment 10. Even in the embodiment 10, partial discharge currents were observed when voltages were applied between the winding turns, between the winding and the core and between the different phases. As a result, discharge currents occurred at the time when the voltage was applied between the winding turns, but no discharge current occurred at the other times. This implies that even the detecting apparatus of the embodiment 10 can precisely detect the partial discharge between the winding turns. Even in the embodiment 10, since part of the surge voltage was propagated to the non-tested phase by the capacitive coupling through the lead wire, the peak voltage between the different phases was reduced to less than 2 E.

FIG. 31 shows the voltages applied to the insulating portions when the motor is tested by the detecting apparatus of the embodiment 10. Even in the embodiment 10, the voltage across the turn-to-turn insulation was higher than the partial discharge inception voltage (CSV) measured in the elemental model. Thus, it can be considered that a partial discharge occurred between the winding turns. On the other hand, since the voltages across the winding-to-core insulation and across the phase-to-phase insulation are about ½ the partial discharge inception voltages (CSV) measured in the elemental models, it can be considered that no partial discharge occurred in those insulating portions. Therefore, it is clear that even the detecting apparatus of the embodiment 10 can efficiently apply the voltage between the winding turns and accurately detect the partial discharge occurring between the winding turns.

FIG. 26A shows an embodiment 11 of the detecting apparatus according to the invention. The turn-to-turn partial discharge measurement in the embodiment 11 is performed by using the same conventional impulse winding test equipment as in the comparative example described later. However, the embodiment 11 is different from the conventional test method in that the core of the test motor is grounded. Specifically, in the surge generator of the detecting apparatus of the embodiment 11, the voltage is regulated by an isolating transformer, slidax 281, and the DC current is generated by using a rectifying circuit 282, DC smoothing/overcurrent detecting elements 262, 263 and capacitors 264, 265. The DC current flows from resistors 266 and 277 through a load resistor 272 to charge capacitors 270 and 271. In addition, when switches 268 and 269 are alternately switched on, impulse voltage waveforms of both polarities appear as the surge voltage to earth across the load resistor 272 and at an impulse voltage output terminal 275 as shown in FIG. 26B on the upper right side. Furthermore, since the motor core 25 is grounded, the surge voltage to earth is directly applied between the tested phase windings and the core. The switches may be, for example, sphere gap, thyratron thyristor, GTO, IGBT, MOSFET or mercury relay. In this figure, a reference numeral 276 depicts a partial discharge current detector.

FIG. 2 shows the waveforms of the turn-to-turn voltage, winding-to-core voltage, phase-to-phase voltage and partial discharge current measured when the partial discharge is caused with the use of the detecting apparatus of the embodiment 11. In the embodiment 11, partial discharge currents were observed when voltages were applied between the winding turns, between the winding and the core and between the different phases. As a result, partial discharges 206, 207 occurred not only at the time when the voltage was applied between the winding turns, but also in the decay part of voltage waveform where the impulse voltage is low. In addition, in order that the voltage of the same magnitude as in the embodiments 1 through 10 can be applied distributed between the winding turns, a voltage that is twice as high as that voltage must be applied between the winding and the core and between the different phases. This implies that the detecting apparatus of the embodiment 11 cannot precisely detect the partial discharge occurring between the winding turns because partial discharges also occur between the winding and the core and between the different phases except between the winding turns. As to the winding-core voltage, the voltage waveform line, 203 indicates the winding-to-core voltage on the lead wire when the surge voltage is applied to the lead wire end of the tested phase winding of the motor, and the voltage waveform line, 204 the winding-to-core voltage measured at part of the winding turns.

FIG. 29 shows the voltages applied to the insulating portions when the motor is tested by the detecting apparatus of the embodiment 11. In the embodiment 11, the voltage across the turn-to-turn insulation was higher than the partial discharge inception voltage (CSV) measured in the elemental model. Thus, it can be considered that a partial discharge occurred between the winding turns. However, the winding-to-core voltage is also higher than the partial discharge inception voltage (CSV) measured in the elemental model. Thus, it can be considered that a partial discharge occurred between the winding and the core. Consequently, since partial discharges occur not only between the winding turns, but also between the winding and the core in the detecting apparatus of embodiment 11, the partial discharge between the winding turns cannot be precisely measured. However, in the embodiment 11, the phase-to-phase voltage is lower than the partial discharge inception voltage (CSV) measured in the elemental model. Thus, the partial discharge did not occur between the different phases unlike the comparative example 1 tested according to the conventional method as will be described later. Accordingly, as to the motor of which the winding-to-core insulation is thicker than that of the test motor, it can be considered that the partial discharge between the winding turns could be detected.

FIG. 27A shows the detecting apparatus of the comparative example 1. In the comparative example 1, the partial discharge between the winding turns was detected by using the conventional impulse power source and turn-to-turn partial discharge detecting method. The surge generator of the detecting apparatus of comparative example 1 is the same as in the embodiment 11. Thus, impulse voltage waveforms of both polarities appear as the voltage to earth across the load resistor 272 and at the impulse voltage output terminal 275 as shown in FIG. 27B on the upper right side. In this comparative example, however, the motor core 25 is not grounded as in the publicly known example according to the conventional detecting method. Therefore, the motor core 25 is floated in potential through a gap or insulator 274, and thus the potential of motor core 25 and the winding-to-core voltage are changed at each measurement by the stray capacitance between the motor windings and the surrounding.

FIG. 2 shows the waveforms of turn-to-turn voltage, winding-to-core voltage, phase-to-phase voltage and partial discharge current when partial discharges are caused with the use of the detecting apparatus of comparative example 1. In the comparative example 1, partial discharge currents were observed when voltages were applied between the winding turns, between the winding and the core and between the different phases. As a result, partial discharges occurred not only at the time when the voltage was applied between the winding turns, but also in the decay part of voltage waveform where the impulse voltage is low. In addition, in the comparative example 1, a large partial discharge 208 was observed in addition to the partial discharges as in the embodiment 11. Moreover, in the detecting apparatus of comparative example 1, in order that the voltage of the same magnitude as in embodiments 1 through 10 can be applied distributed between the winding turns, two-fold and three-fold voltages must be applied between the winding and the core and between the phases, respectively. This implies that the detecting apparatus of comparative example 1 cannot accurately detect the partial discharge between the winding turns because partial discharges are caused not only between the winding turns but also between the winding and the core and between the phases.

FIG. 29 shows the voltages applied to the insulating portions when the motor insulation is tested by the detecting apparatus of comparative example 1. In the comparative example 1, since the turn-to-turn voltage is higher than the partial discharge inception voltage (CSV) measured in the elemental model, it can be considered that partial discharges occurred between the winding turns. However, since the voltages applied between the winding and the core and between the phases are also higher than the partial discharge inception voltages measured in the elemental models, it can be considered that partial discharges occurred between the winding and the core and between the phases. Therefore, the detecting apparatus of comparative example 1 cannot correctly measure the partial discharge between the winding turns because partial discharges occur not only between the winding turns, but also between the winding and the core and between the phases. Particularly in the conventional detecting apparatus of comparative example 1, the phase-to-phase voltage is about 1.5 times higher than the partial discharge inception voltage (CSV) measured in the elemental model. This implies that, even when the voltage is boosted from 0 V so that the partial discharge inception voltage (CSV) between the winding turns is tried to measure by using the conventional method of comparative example 1, partial discharges occur between the phases faster than the discharge between the winding turns. Therefore, the conventional detecting apparatus using the impulse voltage cannot precisely measure the partial discharge between the motor winding turns.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An apparatus for detecting partial discharge at a turn-to-turn insulation in a motor, comprising:
   a surge generator including a capacitor configured to charge a DC current, a first switch, and a second switch, wherein the first and second switches are configured to be operated together as a push-pull circuit; and
   a partial discharge current detector configured to detect partial discharge currents between turns of the windings of said motor;
   wherein the surge generator is configured to generate and apply, to windings of said motor, a repeating surge voltage pulse with: a regular period, a substantially constant voltage level, and positive-negative symmetry with respect to a zero voltage level;
   wherein the surge generator is configured to apply the repeating surge voltage pulse to the windings of the motor such that: the first switch switches the output of the capacitor to thereby control the rising of the repeating surge voltage pulse, and the second switch switches the output of the capacitor to thereby control the falling of the repeating surge voltage pulse;
   wherein in order that said surge generator effects a higher voltage between turns of the windings than a voltage between the windings and a core of said motor, said surge generator generates said repeating surge voltage pulse in and between said windings of said motor, at a repetition frequency selected within a range of 50 Hz to 20 kHz; and
   wherein in order that said partial discharge current detector detects partial discharge currents occurring only between turns of the windings of said motor, then at a time of applying said repeating surge voltage pulse to the windings:
      a core of the motor is coupled to ground or a lower voltage side of the surge generator; and,
      a non-tested phase of the winding is coupled to the lower voltage side of the surge generator, coupled to ground via an end resistor, or experiences a floated voltage.

2. The apparatus according to claim 1, wherein the time interval between leading and trailing edges of the waveform of said surge voltage pulse is equal to or longer than a propagation time τ of said surge voltage pulse between said winding turns of said motor.

3. The apparatus according to claim 1, wherein said partial discharge current detector has a current-detection line, in which two high-voltage connecting wires are penetrated through the current-detection line in opposite directions, in order to supply said surge voltage pulse to the lead wires of two-phase windings of said motor.

4. The apparatus according to claim 1, wherein the waveform has a pulse width of at least 10 μs.

5. A method of detecting partial discharges between turns of windings of a motor, comprising:
   applying, via a surge generator to the windings of said motor in order that said surge generator effects a higher voltage between turns of the windings than a voltage between the windings and a core of said motor, a repeating surge voltage pulse with a regular period, substantially constant voltage level, positive-negative symmetry with respect to a zero voltage level, and a frequency selected within a range of 50 Hz to 20 kHz; and;
   detecting partial discharge currents between the winding turns of said motor;
   wherein the surge generator includes a capacitor configured to charge a DC current, a first switch, and a second switch, wherein the first and second switches are configured to be operated together as a push-pull circuit;
   wherein the surge generator applies the repeating surge voltage pulse to the windings of the motor such that: the first switch switches the output of the capacitor to thereby control the rising of the repeating surge voltage pulse, and the second switch switches the output of the capacitor to thereby control the falling of the repeating surge voltage pulse; and
   wherein in order that said detecting partial discharge currents detects partial discharge currents occurring only between turns of the windings of said motor, then at a time of applying said repeating surge voltage pulse to the windings:
      a core of the motor is coupled to ground or a lower voltage side of the surge generator; and,
      a non-tested phase of the winding is coupled to the lower voltage side of the surge generator, coupled to ground via an end resistor, or experiences a floated voltage.

6. The method according to claim 5, wherein the waveform has a pulse width of at least 10 μs.

7. A method of designing the insulation of a motor fed by an inverter, comprising:
   selecting candidates of insulating materials on a basis of an inverter specification, a motor terminal voltage waveform at the time of inverter drive, and the distribution of voltages between the winding turns of said motor;
   producing test models for the insulating portions of said motor windings;
   measuring partial discharge inception voltages of said test models;
   determining said candidates of insulation specifications of said motor based on said partial discharge inception voltages;
   producing test motors based on said determined insulation specifications;
   measuring partial discharge inception voltages between the winding and core, between different phases and between the winding turns of said test motors;
   designing the insulating portions of said motor windings so that said measured partial discharge inception voltages can be higher than the peak voltage across said winding-to-core insulation of said motor driven by said inverter, the peak voltage across said phase-to-phase insulation of said motor and the transient voltage step of surge voltage between the winding and the core of said motor each multiplied by a safety factor; and
   detecting partial discharge currents between the windings of the motor, by applying, via a surge generator to the windings of said motor in order that said surge generator effects a higher voltage between turns of the windings than a voltage between the windings and a core of said motor, a repeating surge voltage pulse with a regular period and substantially constant voltage level, a frequency selected within a range of 50 Hz to 20 kHz, and with a positive-negative symmetry with respect to a zero voltage level;

wherein the surge generator includes a capacitor configured to charge a DC current, a first switch, and a second switch, wherein the first and second switches are configured to be operated together as a push-pull circuit;

wherein the surge generator applies the repeating surge voltage pulse to the windings of the motor such that: the first switch switches the output of the capacitor to thereby control the rising of the repeating surge voltage pulse, and the second switch switches the output of the capacitor to thereby control the falling of the repeating surge voltage pulse; and wherein in order that said detecting partial discharge currents detects partial discharge currents occurring only between turns of the windings of said motor, then at a time of applying said repeating surge voltage pulse to the windings:

a core of the motor is coupled to ground or a lower voltage side of the surge generator; and, a non-tested phase of the winding is coupled to the lower voltage side of the surge generator, coupled to ground via an end resistor, or experiences a floated voltage.

8. The method according to claim 7, wherein the waveform has a pulse width of at least 10 µs.

9. A method of manufacturing motors fed by an inverter, comprising:

measuring partial discharge inception voltages between the winding and the core, between the different phases and between the winding turns of said motors before or after varnish treatment;

making only products acceptable in which said measured partial discharge inception voltages are respectively higher than the peak voltages across the winding-to-core insulation and the phase-to-phase insulation of said motors fed by inverter and the transient voltage step of surge voltage between the winding and the core of said motor fed by inverter each multiplied by a safety factor; and detecting partial discharge currents between the windings of the motor, by applying to the windings of said motor, via a surge generator in order that said surge generator effects a higher voltage between turns of the windings than a voltage between the windings and a core of said motor, a repeating surge voltage pulse with a regular period and substantially constant voltage level, a frequency selected within a range of 50 Hz to 20 kHz, and with positive-negative symmetry with respect to a zero voltage level;

wherein the surge generator includes a capacitor configured to charge a DC current, a first switch, and a second switch, wherein the first and second switches are configured to be operated together as a push-pull circuit;

wherein the surge generator applies the repeating surge voltage pulse to the windings of the motor such that: the first switch switches the output of the capacitor to thereby control the rising of the repeating surge voltage pulse, and the second switch switches the output of the capacitor to thereby control the falling of the repeating surge voltage pulse; and wherein in order that said detecting partial discharge currents detects partial discharge currents occurring only between turns of the windings of said motor, then at a time of applying said repeating surge voltage pulse to the windings:

a core of the motor is coupled to ground or a lower voltage side of the surge generator; and, a non-tested phase of the winding is coupled to the lower voltage side of the surge generator, coupled to ground via an end resistor, or experiences a floated voltage.

10. The method according to claim 9, wherein the waveform has a pulse width of at least 10 µs.

11. A method of detecting partial discharges between the winding turns of a motor, comprising the steps of:

applying to the windings of said motor, via a surge generator in order that said surge generator effects a higher voltage between turns of the windings than a voltage between the windings and a core of said motor, a surge voltage that has the rise time and fall time corresponding to the rise time of the surge voltage observed at the motor terminal when said motor is driven by an inverter;

repeating said surge voltage with a frequency of 50 Hz to 20 kHz, the waveform of said surge voltage having positive-negative symmetry with respect to a zero voltage level; and detecting partial discharge currents between the winding turns of said motor;

wherein the surge generator includes a capacitor configured to charge a DC current, a first switch, and a second switch, wherein the first and second switches are configured to be operated together as a push-pull circuit;

wherein the surge generator applies the repeating surge voltage pulse to the windings of the motor such that: the first switch switches the output of the capacitor to thereby control the rising of the repeating surge voltage pulse, and the second switch switches the output of the capacitor to thereby control the falling of the repeating surge voltage pulse;

wherein in order that said detecting partial discharge currents detects partial discharge currents occurring only between turns of the windings of said motor, then at a time of applying said surge voltage to the windings:

a core of the motor is coupled to ground or a lower voltage side of the surge generator; and a non-tested phase of the winding is coupled to the lower voltage side of the surge generator, coupled to ground via an end resistor, or experiences a floated voltage.

12. The method according to claim 11, wherein the time interval between the leading and trailing edges of the waveform of said surge voltage is equal to or longer than the propagation time $\tau$ of said surge voltage between said winding turns of said motor.

* * * * *